US009196345B2

United States Patent
Inoue et al.

(10) Patent No.: US 9,196,345 B2
(45) Date of Patent: Nov. 24, 2015

(54) DRIVING METHOD OF SEMICONDUCTOR DEVICE

(71) Applicant: SEMICONDUCTOR ENERGY LABORATORY CO., LTD., Atsugi-shi, Kanagawa-ken (JP)

(72) Inventors: Hiroki Inoue, Kanagawa (JP); Takanori Matsuzaki, Kanagawa (JP); Tomoaki Atsumi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/288,894

(22) Filed: May 28, 2014

(65) Prior Publication Data
US 2014/0355339 A1   Dec. 4, 2014

(30) Foreign Application Priority Data

May 30, 2013   (JP) .................. 2013-114562
May 30, 2013   (JP) .................. 2013-114564

(51) Int. Cl.
*G11C 7/12*       (2006.01)
*G11C 7/06*       (2006.01)
*G11C 11/403*     (2006.01)
*G11C 11/4076*    (2006.01)
*G11C 11/4094*    (2006.01)

(52) U.S. Cl.
CPC .......... *G11C 11/403* (2013.01); *G11C 11/4076* (2013.01); *G11C 11/4094* (2013.01)

(58) Field of Classification Search
None
See application file for complete search history.

(56) References Cited

U.S. PATENT DOCUMENTS

| 8,289,753 | B2 | 10/2012 | Yamazaki et al. |
| 8,328,105 | B2 | 12/2012 | Fujita |
| 8,343,799 | B2 | 1/2013 | Ito et al. |
| 8,411,480 | B2 | 4/2013 | Nagatsuka et al. |
| 8,422,272 | B2 | 4/2013 | Inoue et al. |
| 8,487,303 | B2 | 7/2013 | Takemura |
| 8,563,973 | B2 | 10/2013 | Inoue et al. |
| 8,634,228 | B2 | 1/2014 | Matsuzaki et al. |
| 2007/0217260 | A1* | 9/2007 | Kitagawa ............ 365/185.05 |
| 2011/0101339 | A1 | 5/2011 | Yamazaki et al. |
| 2012/0033488 | A1 | 2/2012 | Nagatsuka et al. |
| 2014/0269063 | A1 | 9/2014 | Nagatsuka et al. |
| 2014/0269099 | A1 | 9/2014 | Nagatsuka et al. |
| 2014/0286073 | A1 | 9/2014 | Onuki |

FOREIGN PATENT DOCUMENTS

JP   2012-256400 A   12/2012

* cited by examiner

*Primary Examiner* — James G Norman
(74) *Attorney, Agent, or Firm* — Fish & Richardson P.C.

(57) ABSTRACT

In a memory cell including first to third transistors, the potential of a bit line is set to VDD or GND when data is written through the first transistor. In a standby period, the potential of the bit line is set to GND. In reading operation, the bit line is brought into a floating state at GND, and a source line is set to a potential VDD−α, consequently, the third transistor is turned on. Then, the potential of the source line is output according to the potential of a gate of the second transistor. Note that α is set so that the second transistor is surely off even when the potential of the gate of the second transistor becomes lower from VDD by ΔV in the standby period. That is, Vth+ΔV<α is satisfied where Vth is the threshold value of the second transistor.

23 Claims, 23 Drawing Sheets

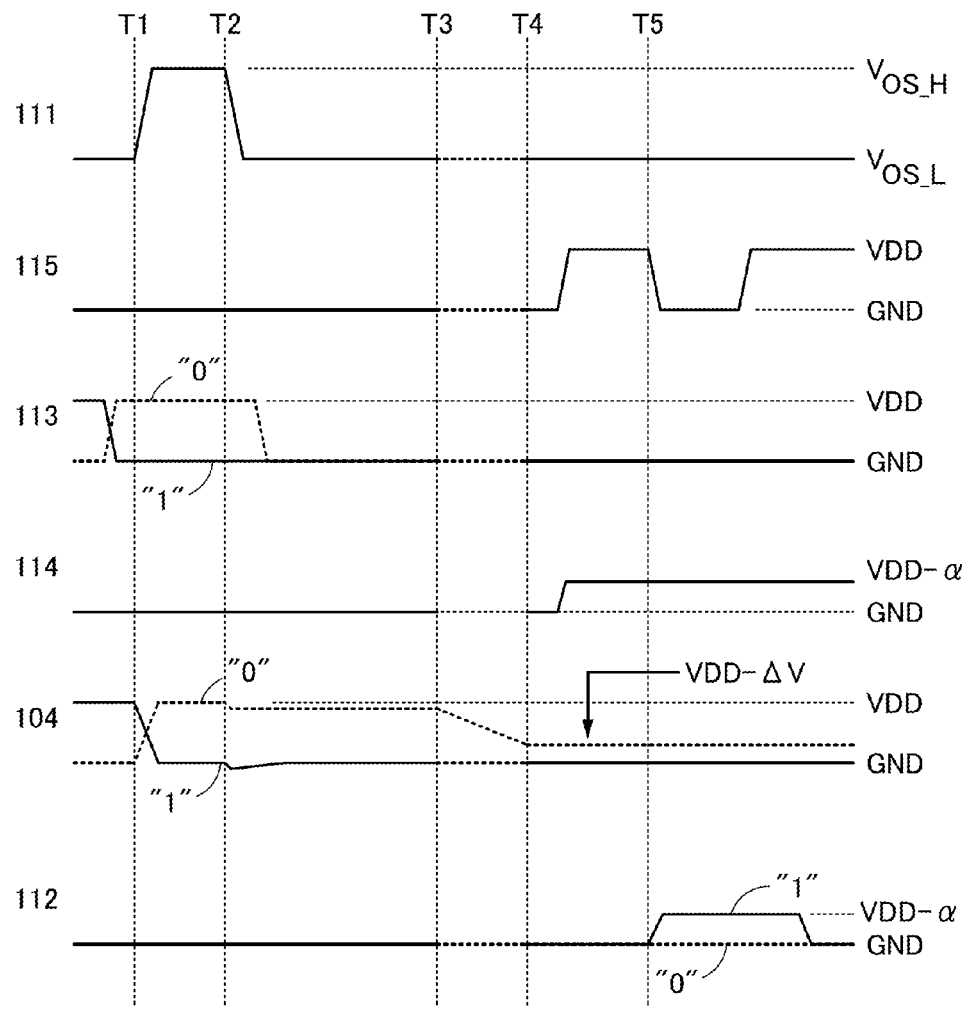

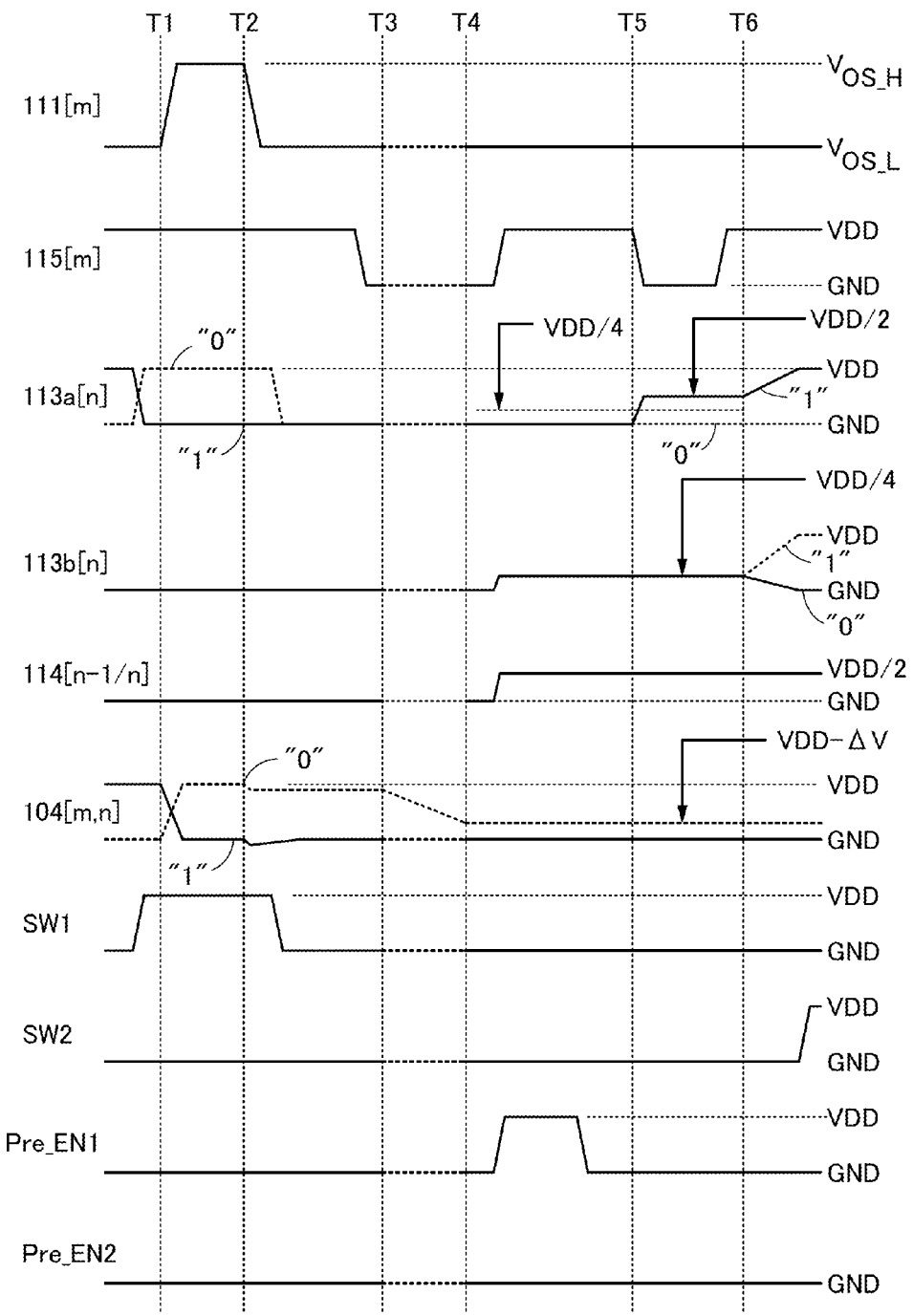

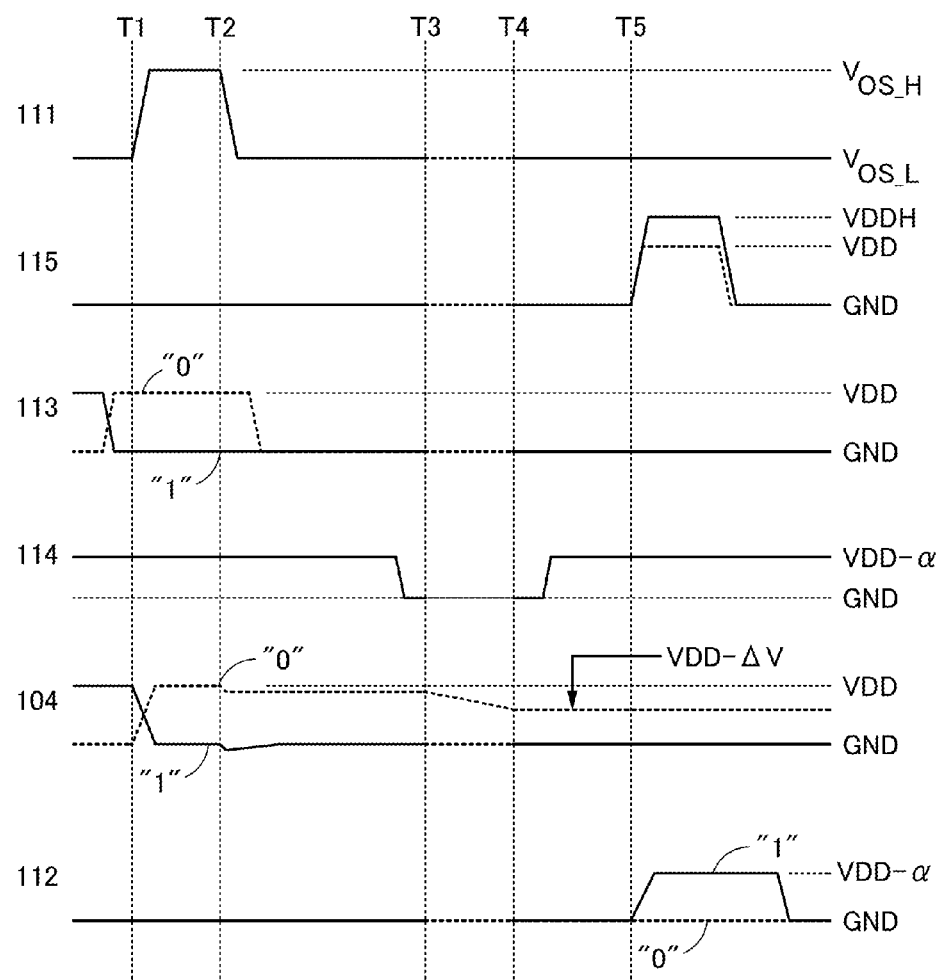

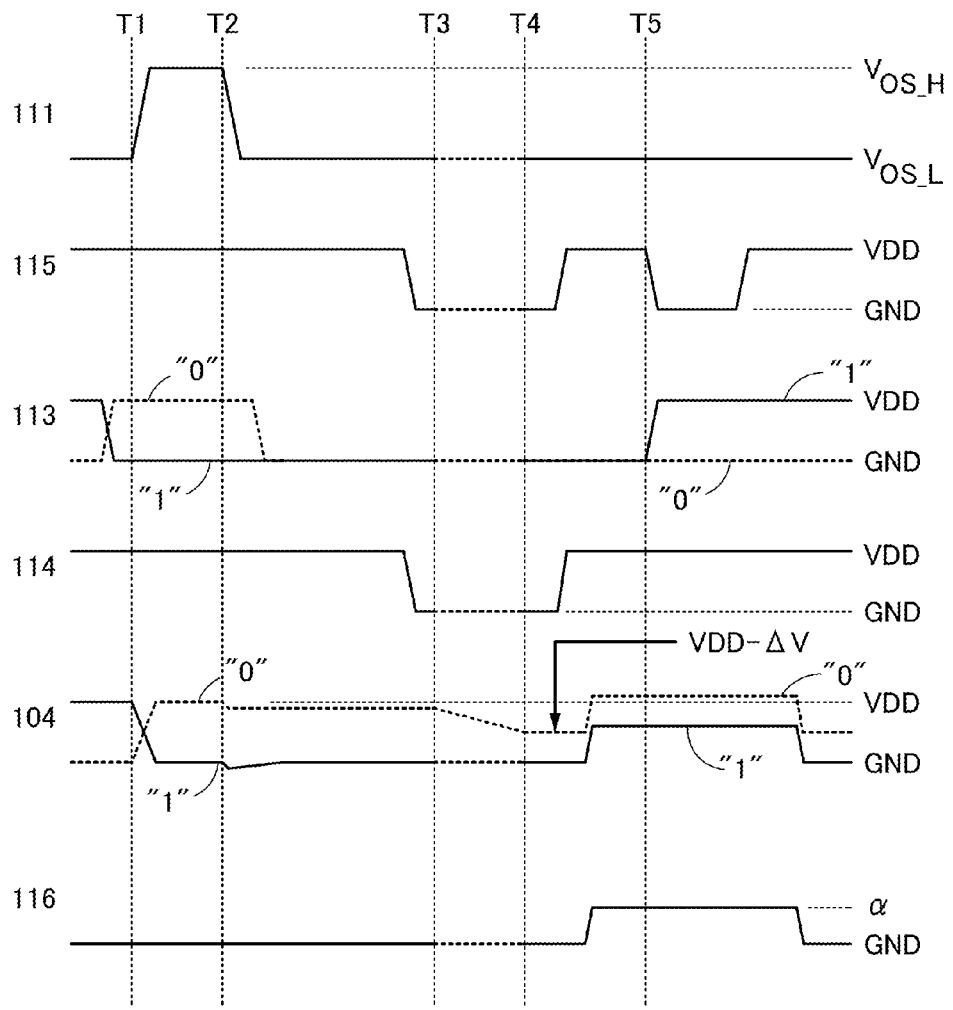

230

DRIVING METHOD OF SEMICONDUCTOR DEVICE

BACKGROUND OF THE INVENTION

1. Field of the Invention

The present invention relates to an object, a method, or a manufacturing method. The present invention relates to, for example, a semiconductor device, a display device, a light-emitting device, a power storage device, a driving method thereof, or a manufacturing method thereof. The present invention relates to a semiconductor device including an oxide semiconductor, for example.

2. Description of the Related Art

Patent Document 1 describes a semiconductor device that includes a transistor using an oxide semiconductor film and a transistor using single crystal silicon. Patent Document 1 also describes a transistor using an oxide semiconductor film has extremely low off-state leakage current.

REFERENCE

Patent Document

[Patent Document 1] Japanese Published Patent Application No. 2012-256400

SUMMARY OF THE INVENTION

One embodiment of the present invention provides a semiconductor device in which incorrect data reading is unlikely to occur. One embodiment of the present invention provides a driving method of a semiconductor device that shows excellent retention characteristics and high reliability.

One object of one embodiment of the present invention is to provide a driving method or the like of a semiconductor device with low off-state current (with high off-state resistance). Another object of one embodiment of the present invention is to provide a driving method or the like of a semiconductor device with low power consumption. An object of one embodiment of the present invention is to provide a driving method or the like of a highly reliable semiconductor device including a semiconductor layer.

Note that the descriptions of these objects do not disturb the existence of other objects. In one embodiment of the present invention, there is no need to achieve all the objects. Other objects are apparent from and can be derived from the description of the specification, the drawings, the claims, and the like.

One embodiment of the present invention is a driving method of a semiconductor device. The semiconductor device includes a first transistor which is an n-channel or p-channel transistor, a second transistor which is a p-channel transistor, and a third transistor which is an n-channel or p-channel transistor. The first transistor includes an oxide semiconductor film in a channel formation region. A gate of the first transistor is electrically connected to a write word line. One of a source and a drain of the first transistor is electrically connected to a write bit line. The other of the source and the drain of the first transistor is electrically connected to a gate of the second transistor. One of a source and a drain of the second transistor is electrically connected to a power supply line to which a constant potential V1 is supplied. The other of the source and the drain of the second transistor is electrically connected to a read bit line. The third transistor is positioned between the second transistor and the read bit line or between the second transistor and the power supply line. A gate of the third transistor is electrically connected to a read word line. In the driving method of the semiconductor device, data writing operation is performed by setting the potential of the write bit line to a potential VH or a potential VL that is lower than VH and turning on the first transistor; data retaining operation is performed by turning off the first transistor; and data reading operation is performed by bringing the read bit line into a floating state while the potential of the read bit line is set to a second potential V2, and then turning on the third transistor. In the case where the threshold value of the second transistor is Vth, and the potential of the gate of the second transistor is V3 (<VH) after a data retention period between the data retaining operation and the data reading operation when the potential of write bit line is set to VH, V2<V1<V3−Vth is satisfied.

One embodiment of the present invention is a driving method of a semiconductor device. The semiconductor device includes a first transistor which is an n-channel or p-channel transistor, a second transistor which is a p-channel transistor, and a third transistor which is an n-channel or p-channel transistor. The first transistor includes an oxide semiconductor film in a channel formation region. A gate of the first transistor is electrically connected to a write word line. One of a source and a drain of the first transistor is electrically connected to a bit line. The other of the source and the drain of the first transistor is electrically connected to a gate of the second transistor. One of a source and a drain of the second transistor is electrically connected to a power supply line to which a constant potential V1 is supplied. The other of the source and the drain of the second transistor is electrically connected to a bit line. The third transistor is positioned between the second transistor and the bit line or between the second transistor and the power supply line. A gate of the third transistor is electrically connected to a read word line. In the driving method of the semiconductor device, data writing operation is performed by setting the potential of the bit line to a potential VH or a potential VL that is lower than VH and turning on the first transistor; data retaining operation is performed by turning off the first transistor; and data reading operation is performed by bringing the bit line into a floating state while the potential of the bit line is set to a second potential V2, and then turning on the third transistor. In the case where the threshold value of the second transistor is Vth, and the potential of the gate of the second transistor is V3 (<VH) after a data retention period between the data retaining operation and the data reading operation when the potential of write bit line is set to VH, V2<V1<V3−Vth is satisfied.

One embodiment of the present invention is a driving method of a semiconductor device. The semiconductor device includes a first transistor which is an n-channel or p-channel transistor, a second transistor which is a p-channel transistor, a third transistor which is an n-channel or p-channel transistor, and a capacitor. The first transistor includes an oxide semiconductor film in a channel formation region. A gate of the first transistor is electrically connected to a write word line. One of a source and a drain of the first transistor is electrically connected to a bit line. The other of the source and the drain of the first transistor is electrically connected to a gate of the second transistor and one electrode of the capacitor. One of a source and a drain of the second transistor is electrically connected to a power supply line to which a constant potential V1 is supplied. The other of the source and the drain of the second transistor is electrically connected to a bit line. The third transistor is positioned between the second transistor and the bit line or between the second transistor and the power supply line. A gate of the third transistor is electrically connected to a read word line. The other electrode of the capacitor is electrically connected to a capacitor line. In the driving method of the semiconductor device, data writing operation is performed by setting the potential of the bit line to a potential VH or a potential VL that is lower than VH and turning on the first transistor; data retaining operation is performed by turning off the first transistor; and data reading operation is performed by bringing the bit line into a floating state while the potential of the bit line is set to a second potential V2, and then turning on the third transistor and increasing the potential of the capacitor line to a potential V3.

In any of the driving methods, V2+ΔV+Vth<V3<V1+Vth is satisfied where V1 is VH, V2 is VL, Vth is the threshold value of the second transistor, and ΔV is the potential decrease of the gate of the second transistor (0<ΔV<V1) after a data retention period between the data retaining operation and the data reading operation when the potential of write bit line is set to a potential VH.

A semiconductor device that is one embodiment of the present invention can prevent incorrect data reading even when the potential of a gate of a second transistor is changed in data retaining operation. Further, a semiconductor device that is one embodiment of the present invention shows excellent retention characteristics and high reliability.

BRIEF DESCRIPTION OF THE DRAWINGS

FIG. 2 is a timing chart.

FIG. 11 is a timing chart.

FIG. 13 is a timing chart.

FIG. 16 is a timing chart.

DETAILED DESCRIPTION OF THE INVENTION

Figure 1A:
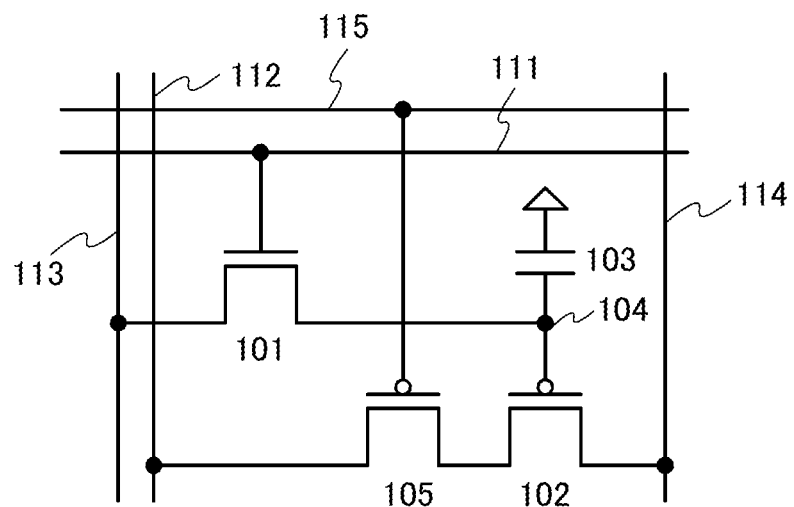
FIGS. 1A and 1B are each a circuit diagram of a memory cell.

Embodiments of the present invention are described below with reference to the drawings. Note that the present invention is not limited to the following description. It is readily appreciated by those skilled in the art that various changes and modifications are possible without departing from the spirit and the scope of the present invention. Therefore, the present invention should not be construed as being limited to the following description of the embodiments. Note that in describing the structure of the present invention with reference to the drawing, reference numerals denoting the same portions are used in different drawings in common in some cases.

Although the block diagram attached to this specification shows components classified by their functions in independent blocks, it is difficult to classify actual components according to their functions completely and it is possible for one component to have a plurality of functions.

Note that a "source" of a transistor also means a source region that is part of a semiconductor film functioning as an active layer or a source electrode electrically connected to the semiconductor film. Similarly, a "drain" of a transistor also means a drain region that is part of a semiconductor film functioning as an active layer or a drain electrode electrically connected to the semiconductor film. A "gate" also means a gate electrode.

Note that what is described (or part thereof) in one embodiment can be applied to, combined with, or exchanged with another content in the same embodiment and/or what is described (or part thereof) in another embodiment or other embodiments.

Note that drawings are schematic views of ideal examples, and the embodiments of the present invention are not limited to the shape or the value illustrated in the drawings. For example, the following can be included: variation in shape due to a manufacturing technique or dimensional deviation; or variation in signal, voltage, or current due to noise or difference in timing.

Note that the ordinal numbers such as "first" and "second" in this specification are used for the sake of convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

Embodiment 1

FIG. 1A illustrates a memory cell 100a. In this specification, "a memory cell" means "a semiconductor device having a memory function" and thus may also have a function other than a memory function. The memory cell 100a includes a transistor 101, a transistor 102, a capacitor 103, and a transistor 105.

The transistor 101 includes an oxide semiconductor film in its channel formation region. Thus, the transistor 101 has an extremely small off-state current (extremely high off-state resistance). The transistor 101 is turned on when data is written, and accordingly is also referred to as a write transistor. The transistor 101 may be an n-channel or p-channel transistor. The following description is made on the case where the transistor 101 is an n-channel transistor.

A gate of the transistor 101 is electrically connected to a wiring 111. The wiring 111 can function as a write word line. In the case where the transistor 101 is a thin film transistor, gate electrodes may be provided under and over its thin film semiconductor layer. Further, one of the gate electrodes may be always kept at a constant potential.

One of a source and a drain of the transistor 101 is electrically connected to a wiring 113. The wiring 113 can function as a write bit line.

The other of the source and the drain of the transistor 101 is electrically connected to one electrode of the capacitor 103. The other electrode of the capacitor 103 is preferably retained at a constant potential. The other of the source and the drain of the transistor 101 is electrically connected to a gate of the transistor 102. The capacitor does not have to be intentionally provided in some cases.

The transistor 102 is a p-channel transistor. Various materials such as an oxide semiconductor and silicon can be used for a channel formation region of the transistor 102. One of a source and a drain of the transistor 102 is electrically connected to one of a source and a drain of the transistor 105. The other of the source and the drain of the transistor 102 is electrically connected to a wiring 114.

The other of the source and the drain of the transistor 105 is electrically connected to a wiring 112. The wiring 112 can function as a read bit line. A gate of the transistor 105 is electrically connected to a wiring 115. The transistor 105 is a transistor for electrically connecting the transistor 102 and the wiring 112 when data is read, and is also referred to as a selection transistor.

The wiring 114 can function as a source line or a power supply line. Although the wiring 114 is preferably retained at a constant potential, the potential may be changed when power is stopped or supplied.

Figure 1B:
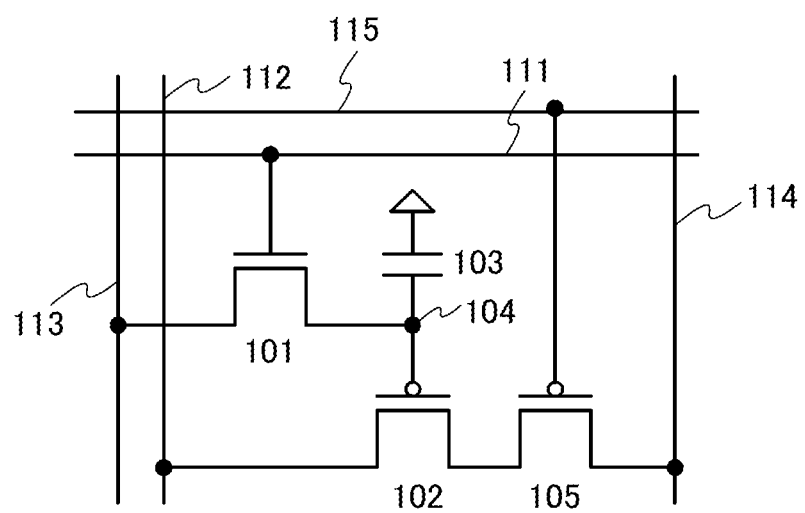

As in a memory cell 100b of FIG. 1B, a source and a drain of the transistor 105 may be positioned between the transistor 102 and the wiring 114.

In the memory cell 100a in FIG. 1A, data is retained as the potential of a node 104. If the transistor 101 has sufficiently high off-state resistance, data can be retained for a very long period. Theoretically, a data retaining period is determined depending on all capacitance between the node 104 and each of other nodes (including the capacitance of the capacitor 103) and all resistance between the node 104 and each of other nodes (including the off-state resistance of the transistor 101).

For example, when the capacitance is 30 fF and the resistance is $1\times10^{22}\Omega$, the time constant is 9.5 years. Accordingly, after ten years, the difference between the potential of the node 104 and a reference potential becomes lowered to approximately 35% of the difference between the initial potential and the reference potential. A reading method by which data reading is correctly performed even in such a case where the potential is lowered is required.

Operation for writing data to the memory cell 100a and operation for reading data from the memory cell 100a are described below with reference to FIG. 2. The threshold values of the transistors 102 and 105 are each lower than 0 and higher than −VDD.

(Writing Operation)

Data writing is performed by setting the potential of the wiring 113 serving as a write bit line to a potential corresponding to data and then turning off the transistor 101. This method is basically the same as the method for data writing to DRAM. The transistor 101 is different from the transistors 102 and 105 in the threshold value or the like; thus, here, when the transistor 101 is turned on, the potential of its gate (the potential of the wiring 111) is set to $V_{OS\_H}$, and when the transistor 101 is turned off, the potential of its gate is set to $V_{OS\_L}$. Note that $V_{OS\_L}$ may be equal to GND (<VDD).

Here, the potential of the wiring 113 is set to GND when data "1" (one of two levels) is written, and is set to VDD when data "0" (the other of the two levels) is written. At Time T1 in FIG. 2, the potential of the wiring 111 starts to increase, so that the transistor 101 is turned on. As a result, the node 104 becomes at a potential corresponding to data. For example, when data "1" is written, the potential of the node 104 becomes GND, and when data "0" is written, the potential of the node 104 becomes VDD. At Time T2, the potential of the wiring 111 starts to decrease, so that the transistor 101 is turned off, and writing is finished. When the transistor 101 is turned off, the potential of the node 104 is slightly lowered by capacitive coupling between the gate of the transistor 101 (and the wiring 111) and the node 104.

In writing, the wirings 112, 114, and 115 may have any potentials; however, a potential at which current does not flow between the wirings 112 and 114 is preferable. For example, when there is a potential difference between the wirings 112 and 114, the potential of the wiring 115 is preferably the one at which the transistor 105 is turned off. For instance, when the wirings 112 and 114 both have a potential higher than or equal to GND and lower than or equal to VDD, the wiring 115 is preferably at VDD. Alternatively, the wirings 112 and 114 may have no potential difference. Here, each of the potentials of the wirings 112, 114, and 115 is GND.

(Retaining Operation)

When data is retained, the transistor 101 is turned off. In FIG. 2, a period in which data is retained while power supply is stopped (standby period) is from Time T3 to Time T4. In the standby period, all the wirings have the same potential (here, GND). In the case where the potential of the node 104 is higher than GND at this time, the potential of the node 104 is gradually lowered.

In the case where data "1" has been written, the potential of the node 104 is close to GND; thus, its change does not become a significant problem. In contrast, in the case where data "0" has been written, the potential of the node 104 is close to VDD at first, but is lowered over time. The potential decrease is $\Delta V$ (>0). That is, the potential of the node 104 (the potential of the gate of the transistor 102) is VDD−$\Delta V$ after the data retention period. Under the above conditions, the potential is lowered by approximately 10% in the case where the retention period is about one year, but is lowered to 35% of the initial potential after ten years as described above. In other words, $\Delta V$=0.65×VDD. Here, in the case where the potential decrease of the node 104 is largest, the potential of the node 104 after the period in which data retention is assured becomes VDD−$\Delta V_{MAX}$.

(Reading Operation)

Data reading operation is performed by setting the potentials of the wiring 112 and the wiring 114 to different potentials, turning on the transistor 105, and determining whether current flows between the source and the drain of the transistor 102. Depending on the potential of the node 104, the conduction state of the transistor 102 varies, so that written data can be determined.

Specifically, the potential of the wiring 115 is set to an appropriate value (here, VDD), the transistor 105 is turned off, and the potential of the wiring 114 is set to VDD−α (>GND). Note that α is greater than or equal to 0 and less than VDD. The details are described later. After the wiring 112 is precharged to an appropriate potential (here, GND), the wiring 112 is brought into a floating state. Then, at Time T5, the potential of the wiring 115 is set to an appropriate value (here, GND), so that the transistor 105 is turned on.

In the case where data "1" has been written, the potential of the node 104 is close to GND, and thus the transistor 102 is turned on and the potential of the wiring 112 becomes VDD−

α. On the other hand, in the case where data "0" has been written, the transistor 102 is off, and thus the potential of the wiring 112 is hardly changed.

Here, a decrease in potential in the standby period becomes a problem. In the case where data "0" has been written, the lowest potential of the node 104 is VDD−$\Delta V_{MAX}$. In this case, the transistor 102 is turned on depending on the potential of the wiring 114, whereby the potential of the wiring 112 becomes VDD−α.

In such a case, even though data "0" has been written, the potential of the wiring 112 becomes the potential that is the same as the one in the case where data "1" has been written; consequently, it is incorrectly determined that data "1" has been written.

Thus, the potential of the wiring 114 needs to be a potential at which the transistor 102 is not turned on. That is, when the threshold value of the transistor 102 is Vth, Vth+$\Delta V_{MAX}$<α.

For example, α is greater than 0.7 [V] when VDD=+1.8 [V], GND=0 [V], Vth=−0.5 [V], and $\Delta V_{MAX}$=1.2 [V] are satisfied. Under the conditions, the potential of the wiring 112 remains 0 [V] in the case of data "0" and is increased to the potential of the wiring 114 (lower than +1.1 [V]) in the case of data "1". Alternatively, α is greater than 0.2 [V] when VDD=+0.9 [V], GND=0 [V], Vth=−0.4 [V], and $\Delta V_{MAX}$=0.6 [V] are satisfied. Under the conditions, the potential of the wiring 112 remains 0 [V] in the case of data "0" and is increased to the potential of the wiring 114 (lower than +0.7 [V]) in the case of data "1".

Under the above conditions, incorrect data reading does not occur even when $\Delta V$ has any value (note that 0<$\Delta V$<$\Delta V_{MAX}$).

As described above, in the case where the potential of the node 104 is lowered from the initial potential by greater than or equal to 60% (in the case where the potential of the node 104 is lowered to less than or equal to 40% of the initial potential) in the standby period, the potential of the wiring 114 is preferably set to lower than VDD.

Note that although the written potential is initially VDD in the case of data "0", the potential output to the wiring 112 is GND. It needs to be noted that inverted data is output like this. An output potential is lower than VDD and thus is preferably amplified using an inverter or a sense amplifier described later.

Figure 3:
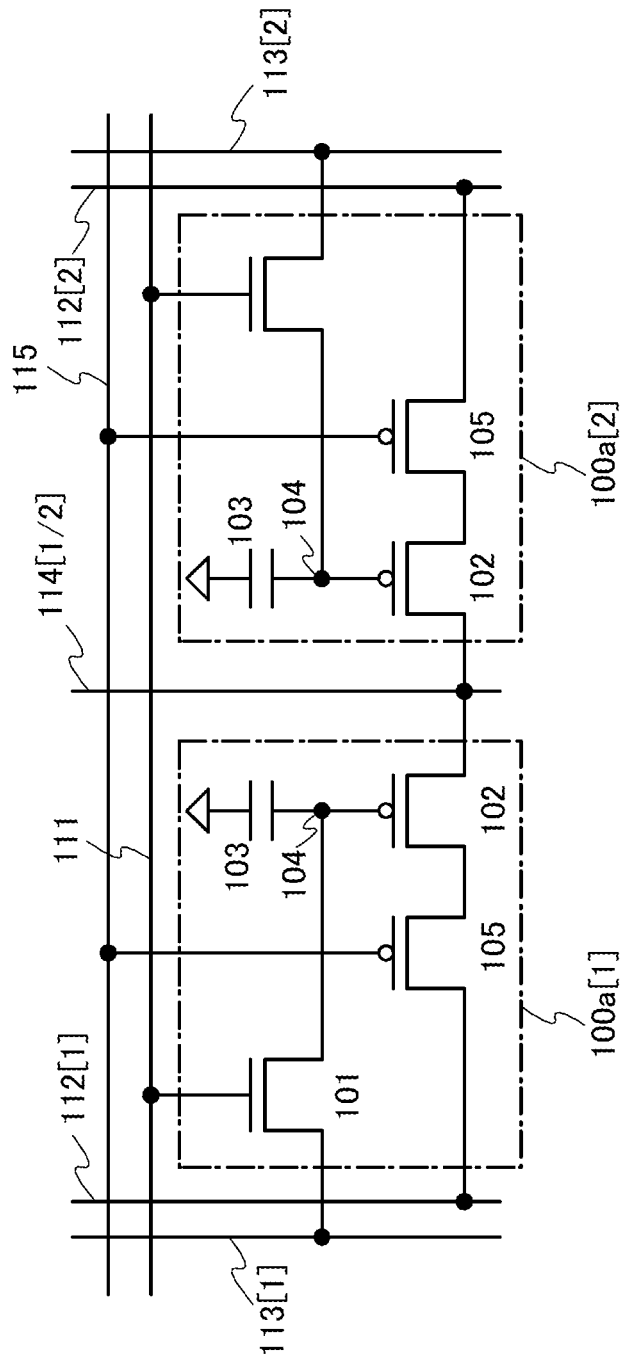
FIG. 3 is a circuit diagram of a memory cell.

Although it is apparent from the above description, the potential of the wiring 114 needs to be a specific value when data is read. Note that the wiring 114 may be shared by two memory cells 100a[1] and 100a[2] as illustrated in FIG. 3. Alternatively, the wiring 114 may be shared by three or more memory cells. The wiring 114 does not have to be parallel to the wiring 112. The wiring 114 and the wiring 112 may intersect each other at right or other angles or be provided in matrix.

Embodiment 2

Figure 4A:
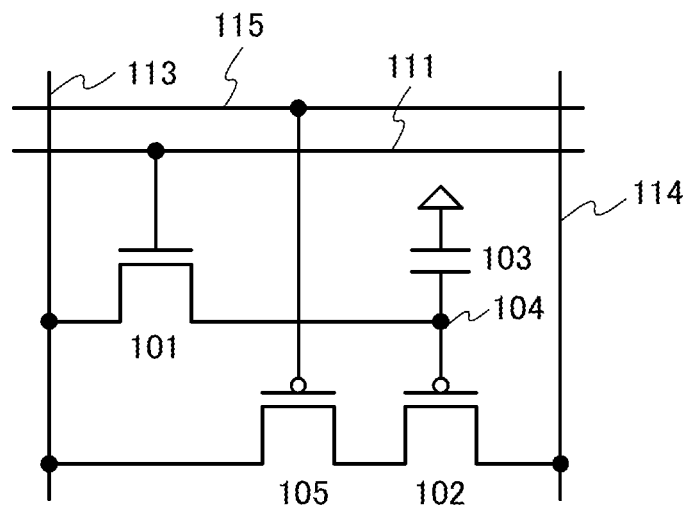
FIGS. 4A and 4B are each a circuit diagram of a memory cell.

FIG. 4A illustrates a memory cell 110a. The memory cell 110a includes the transistor 101, the transistor 102, the capacitor 103, and the transistor 105. These are the same as those described in Embodiment 1.

A gate of the transistor 101 is electrically connected to the wiring 111. One of a source and a drain of the transistor 101 is electrically connected to the wiring 113. The other of the source and the drain of the transistor 101 is electrically connected to one electrode of the capacitor 103. The other of the source and the drain of the transistor 101 is electrically connected also to a gate of the transistor 102.

One of a source and a drain of the transistor 102 is electrically connected to one of a source and a drain of the transistor 105. The other of the source and the drain of the transistor 102 is electrically connected to the wiring 114. The other of the source and the drain of the transistor 105 is electrically connected to the wiring 113. A gate of the transistor 105 is electrically connected to the wiring 115.

Functions of the wirings 111, 114, and 115 are the same as those described in Embodiment 1. In the memory cell 110a, the wiring 113 can also serve as the wiring 112. Thus, in the memory cell 110a, the wiring 113 serves as a write bit line and a read bit line.

Figure 4B:
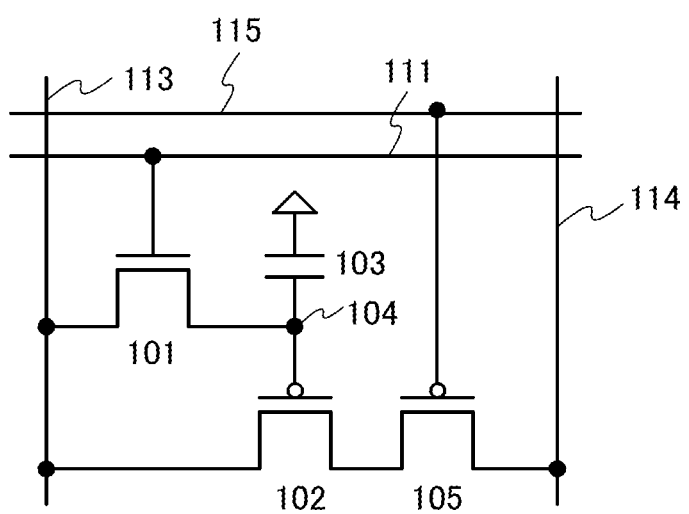

As in a memory cell 110b of FIG. 4B, the transistor 105 may be positioned between the transistor 102 and the wiring 114.

Figure 5:
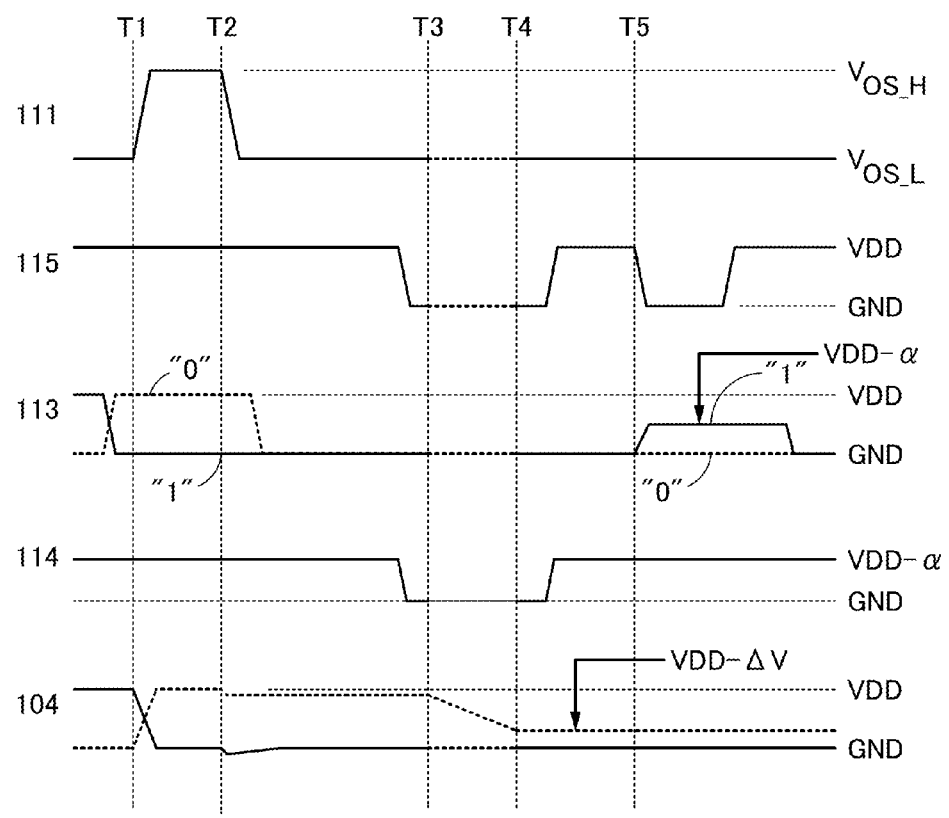
FIG. 5 is a timing chart.

Operation for writing data to the memory cell 110a and operation for reading data from the memory cell 110a are described below with reference to FIG. 5. The threshold values of the transistors 102 and 105 are each lower than 0 and higher than −VDD. Detailed descriptions of the same operations as those in Embodiment 1 may be omitted.

(Writing Operation)

From Time T1, the potential of the wiring 111 is increased to $V_{OS\_H}$, whereby the transistor 101 is turned on. The potential of the wiring 113 is set to GND or VDD. As in Embodiment 1, the potential of the wiring 113 is set to GND when data "1" is written and is set to VDD when data "0" is written.

At this time, it is preferable that current do not flow between the wirings 113 and 114. For example, the wirings 113 and 114 may have no potential difference. That is, as in the case of the wiring 113, the potential of the wiring 114 may be changed in accordance with data.

In a more effective method, the potential of the wiring 115 is set to a potential at which the transistor 105 is turned off. The potentials of the wirings 113 and 114 are each lower than or equal to VDD here; accordingly, the potential of the wiring 115 is set to VDD. In this embodiment, the potential of the wiring 114 remains VDD−α except in the standby period. Note that α is the same as the one described in Embodiment 1.

(Retaining Operation)

The transistor 101 is turned off. In FIG. 5, a standby period is from Time T3 to Time T4. In the standby period, all the wirings have the same potential (here, GND).

(Reading Operation)

The potential of the wiring 114 becomes VDD−α because the standby period ends. First, the potential of the wiring 115 is set to VDD to turn off the transistor 105. Furthermore, the wiring 113 is precharged to GND, and then is brought into a floating state. Next, the potential of the wiring 115 is set to GND to turn on the transistor 105.

With a described in Embodiment 1, in the case where data "1" has been written, the potential of the node 104 is close to GND, and thus the transistor 102 is on and the potential of the wiring 113 is VDD−α. On the other hand, in the case where data "0" has been written, the transistor 102 is off, and thus the potential of the wiring 113 is hardly changed.

The structure described in this embodiment can be used in appropriate combination with the structure described in any of the other embodiments.

Embodiment 3

In this embodiment, examples of semiconductor devices to which the memory cells described in FIGS. 1A and 1B, FIG. 3, and FIGS. 4A and 4B can be applied are described with reference to FIG. 6, FIG. 7A, and FIG. 8 to FIG. 11.

(Configuration Example of Semiconductor Device 200)

Figure 6:
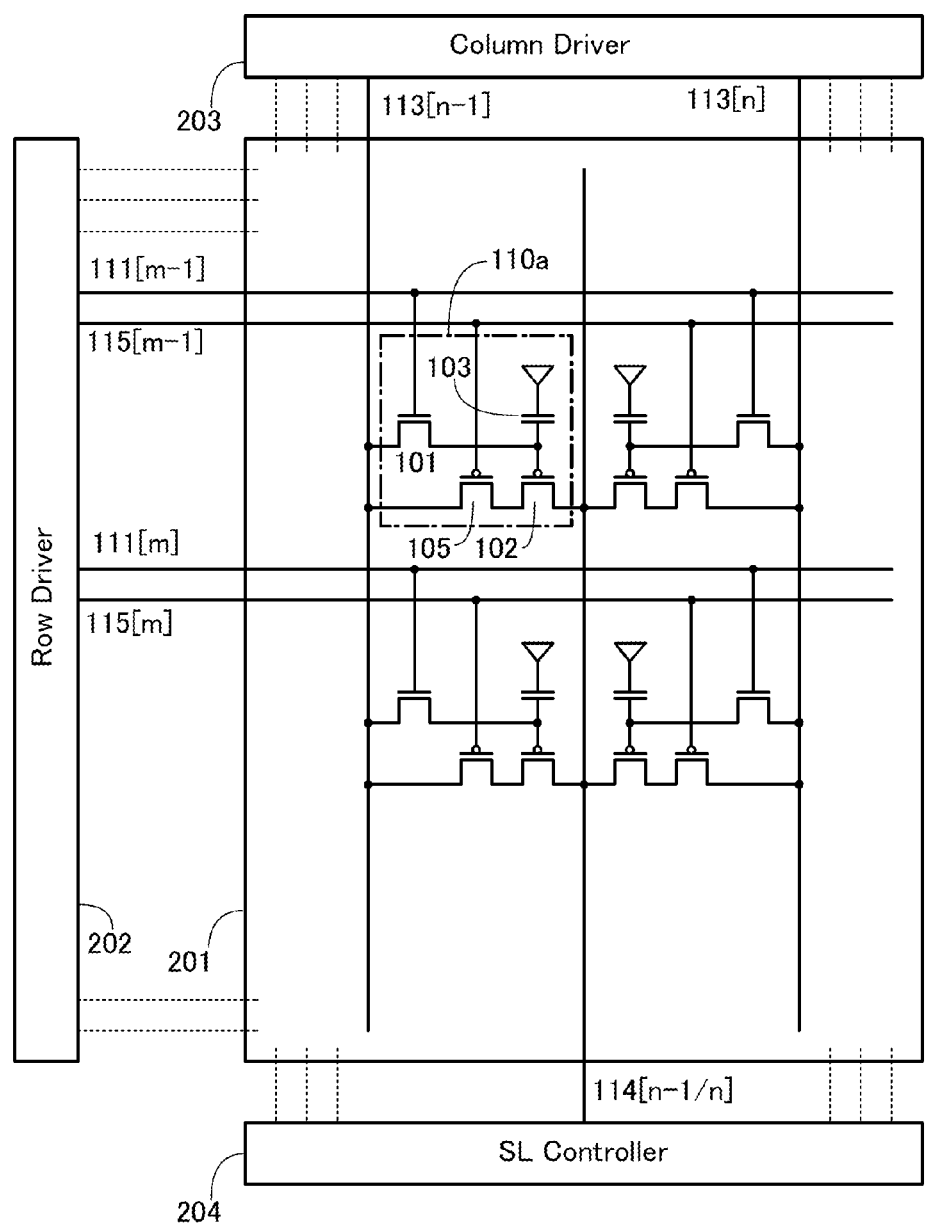
FIG. 6 is a circuit block diagram of a semiconductor device.

FIG. 6 is a block diagram of a configuration example of a semiconductor device 200 including the memory cell 110a described with reference to FIG. 4A.

The semiconductor device 200 illustrated in FIG. 6 includes a memory cell array 201, a row driver 202, a column driver 203, and a power supply line controller 204. FIG. 6 illustrates, as the wirings 111, 113, 114, and 115, the wiring 111[m−1] and the wiring 115[m−1] in the (m−1)-th row; the wiring 111[m] and the wiring 115[m] in the m-th row; the wiring 113[n−1] in the (n−1)-th column; the wiring 113[n] in the n-th column; and the wiring 114[n−1/n] that is shared by the (n−1)-th column and the n-th column.

In the memory cell array 201 illustrated in FIG. 6, the memory cells 110a described with reference to FIG. 4A are arranged in matrix. As described above with reference to FIG. 3, two adjacent memory cells 110a share one wiring 114. Components of the memory cells 110a are similar to the components of the memory cell shown in FIG. 4A; thus, the description of FIG. 4A can be referred to.

The row driver 202 is a circuit that has a function of selectively turning on the transistors 101 and 105 in each row of the memory cells 110a. Specifically, the row driver 202 is a circuit that supplies signals to the wirings 111, 112, and 115. With the row driver 202, the semiconductor device 200 can perform data writing to and data reading from the memory cells 110a by selecting the memory cells 110a row by row.

The column driver 203 is a circuit that has functions of precharging the wiring 113 in the memory cell 110a, bringing the wiring 113 into an electrically floating state, supplying a potential corresponding to data to the wiring 113, and outputting, to the outside, the potential of the wiring 113 that corresponds to data retained in the memory cell 110a. With the column driver 203, the semiconductor device 200 can perform data writing to and data reading from the memory cells 110a.

The power supply line controller 204 is a circuit that has a function of making the wiring 114 have a potential appropriate for reading (corresponding to the potential VDD−α in Embodiment 1) when data is read from the memory cell 110a. In the case where the wiring 114 is set to always have a potential appropriate for reading while power is supplied to the semiconductor device 200, a constant voltage power supply can be used.

(Configuration Example of the Row Driver 202)

Figure 7A:
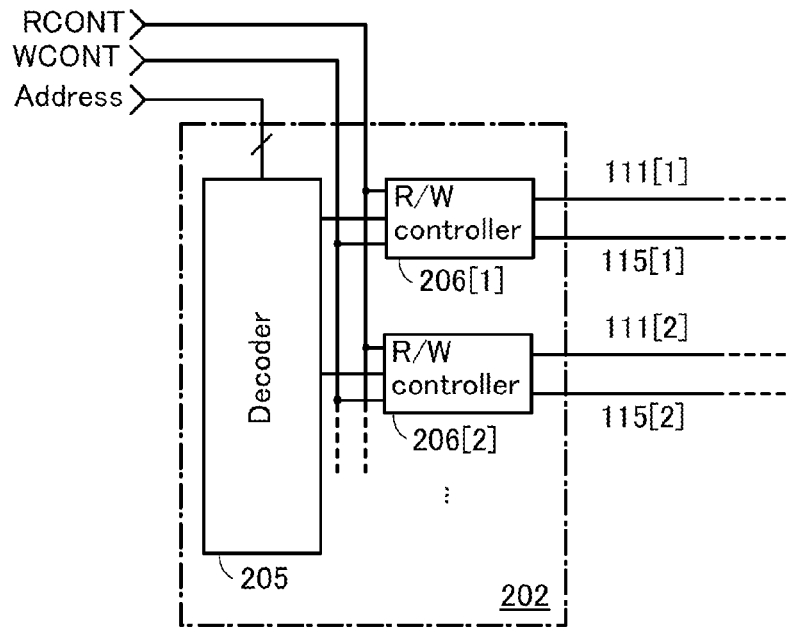
FIGS. 7A and 7B are each a circuit block diagram of a row driver.

FIG. 7A is a block diagram illustrating a configuration example of the row driver 202 described with reference to FIG. 6.

The row driver 202 illustrated in FIG. 7A includes a decoder 205 and controllers 206. Each row is provided with the controller 206. The controller 206[1] is provided in the first row, and the controller 206[2] is provided in the second row. The controller 206 in each row is connected to the wirings 111 and 115.

The decoder 205 is a circuit that has a function of outputting a signal for selecting the row corresponding to an address signal (Address).

The controller 206 is a circuit that has a function of outputting, to the wirings 111 and 115 in the row selected by the decoder 205, signals corresponding to a write control signal WCONT or a read control signal RCONT.

(Configuration Example of the Column Driver 203)

Figure 8:
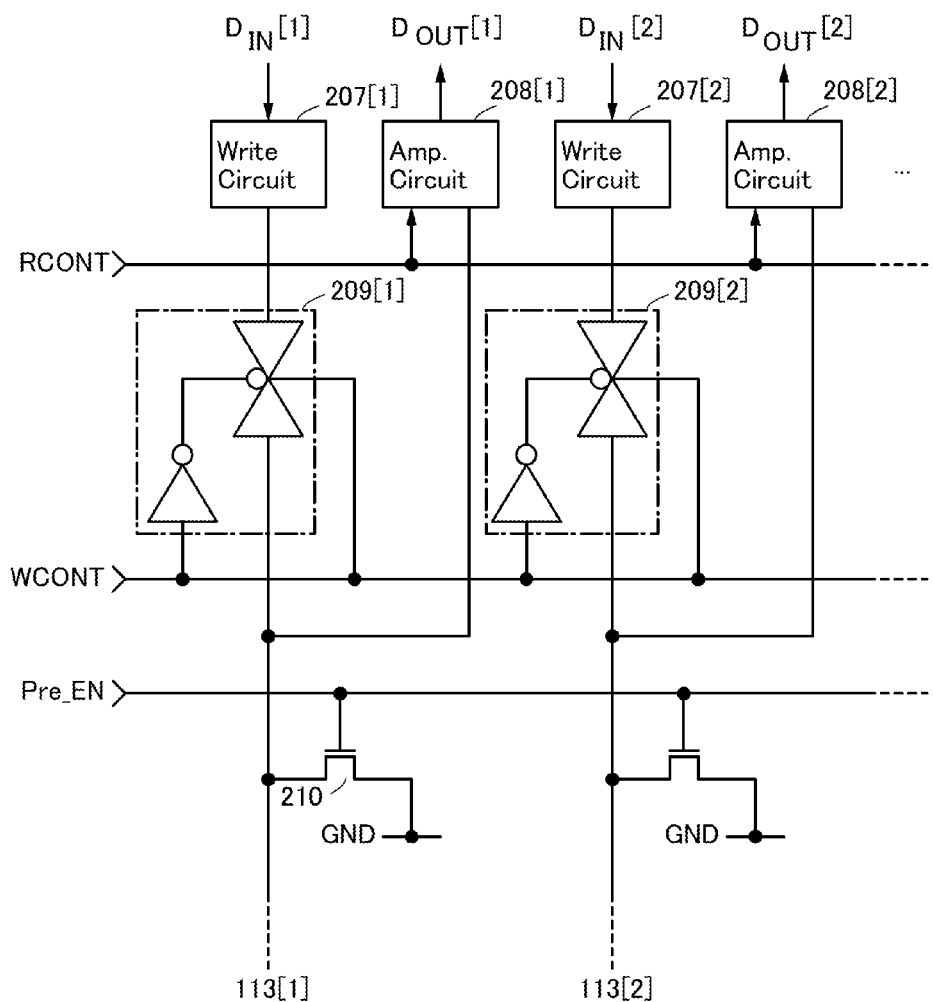
FIG. 8 is a circuit block diagram of a column driver.

FIG. 8 is a block diagram illustrating part of the column driver 203 described with reference to FIG. 6.

The column driver 203 illustrated in FIG. 8 includes write circuits 207, amplifier circuits 208, switch circuits 209, and transistors 210. Each column is provided with the write circuit 207, the amplifier circuit 208, the switch circuit 209, and the transistor 210. The switch circuit 209 and the transistor 210 in each column are connected to the wiring 113.

The write circuit 207 is a circuit that outputs, to the switch circuit 209, a potential corresponding to data $D_{IN}$ that is input to the column.

The amplifier circuit 208 is a circuit that amplifies the potential of the wiring 113 and outputs data $D_{OUT}$. For example, an inverter, a sense amplifier, or the like can be used as the amplifier circuit 208. It is preferable that the operation of the amplifier circuit 208 be controlled by the read control signal RCONT. For example, a clocked inverter can be used in that case.

The switch circuit 209 is a circuit that has functions of connecting the write circuit 207 to the wiring 113 and bringing the wiring 113 into an electrically floating state. Specifically, depending on the write control signal WCONT, the write circuit 207 is connected to the wiring 113 or the wiring 113 is brought into an electrically floating state. Although a circuit including an analog switch and an inverter is illustrated in the drawing, the switch circuit 209 is not imitated to this.

The transistor 210 is a transistor having functions of supplying a precharge potential GND to the wiring 113 and bringing the wiring 113 into an electrically floating state. Specifically, the transistor 210 is a switch that functions as follows: the transistor 210 is turned on by a precharge control signal Pre_EN, so that the precharge potential GND is supplied to the wiring 113, and then the transistor 210 is turned off, so that the wiring 113 is brought into an electrically floating state. With the transistor 210, the column driver 203 can supply the precharge potential GND to the wiring 113 and then keep the wiring 113 in an electrically floating state.

A decoder may be used for distributing data $D_{IN}$ to columns and collecting data $D_{OUT}$ output from columns. Alternatively, a serial-in/parallel-out circuit (or a parallel-in/serial-out circuit) such as a shift register may be used.

(Configuration Example of Semiconductor Device 220)

Figure 9:
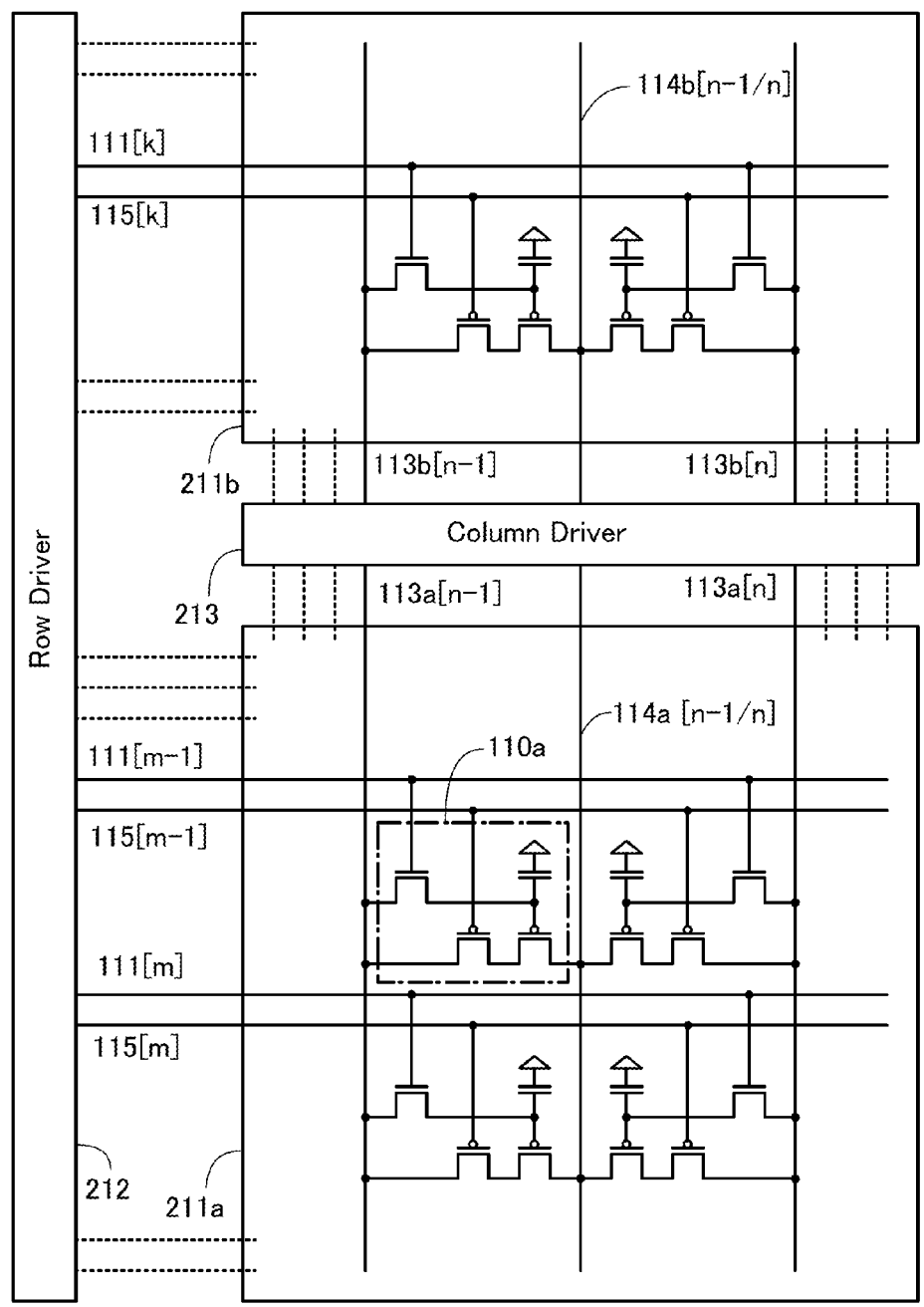
FIG. 9 is a circuit block diagram of a semiconductor device.

FIG. 9 is a block diagram of a configuration example of a semiconductor device 220 including the memory cell 110a described with reference to FIG. 4A.

The semiconductor device 220 illustrated in FIG. 9 includes a memory cell array 211a, a memory cell array 211b, a row driver 212, and a column driver 213. The memory cell array 211a preferably has substantially the same size as that of the memory cell array 211b.

In the memory cell arrays 211a and 211b illustrated in FIG. 9, the memory cells 110a described with reference to FIG. 4A are arranged in matrix. As described above with reference to FIG. 3, two adjacent memory cells 110a share one wiring 114. Components of the memory cells 110a are similar to those of the memory cell shown in FIG. 4A; thus, the description of FIG. 4A can be referred to.

FIG. 9 illustrates, as the wirings 111, 113, 114, and 115, the wiring 111[k] and the wiring 115[k] in the k-th row; the wiring 111[m−1] and the wiring 115[m−1] in the (m−1)-th row; the wiring 111[m] and the wiring 115[m] in the m-th row; the wiring 113a[n−1] and the wiring 113b[n−1] in the (n−1)-th column; the wiring 113a[n] and the wiring 113b[n] in the n-th column; and the wiring 114a[n−1/n] and the wiring 114b[n−1/n] that are each shared by the (n−1)-th column and the n-th column. Further, FIG. 9 illustrates the memory cell 110a that is positioned at an intersection of these wirings.

The wiring 111[k], the wiring 115[k], the wiring 113b[n−1], the wiring 113b[n], and the wiring 114b[n−1/n] are positioned in the memory cell array 211b. The wiring 111[m−1], the wiring 115[m−1], the wiring 111[m], the wiring 115[m], the wiring 113a[n-1], the wiring 113a[n], and the wiring 114a[n-1/n] are positioned in the memory cell array 211a.

The row driver 212 may have the same configuration as that of the row driver 202 described with reference to FIG. 6 and FIG. 7A.

The column driver 213 is a circuit that has functions of making the wirings 113a and 113b have potentials corresponding to data, precharging the wirings 113a and 113b, bringing the wirings 113a and 113b into an electrically floating state, making the wirings 114a and 114b have specific potentials, and amplifying the potential difference between the wirings 113a and 113b. With the column driver 213, the semiconductor device 220 can perform data writing to and data reading from the memory cell 110a.

Figure 10:
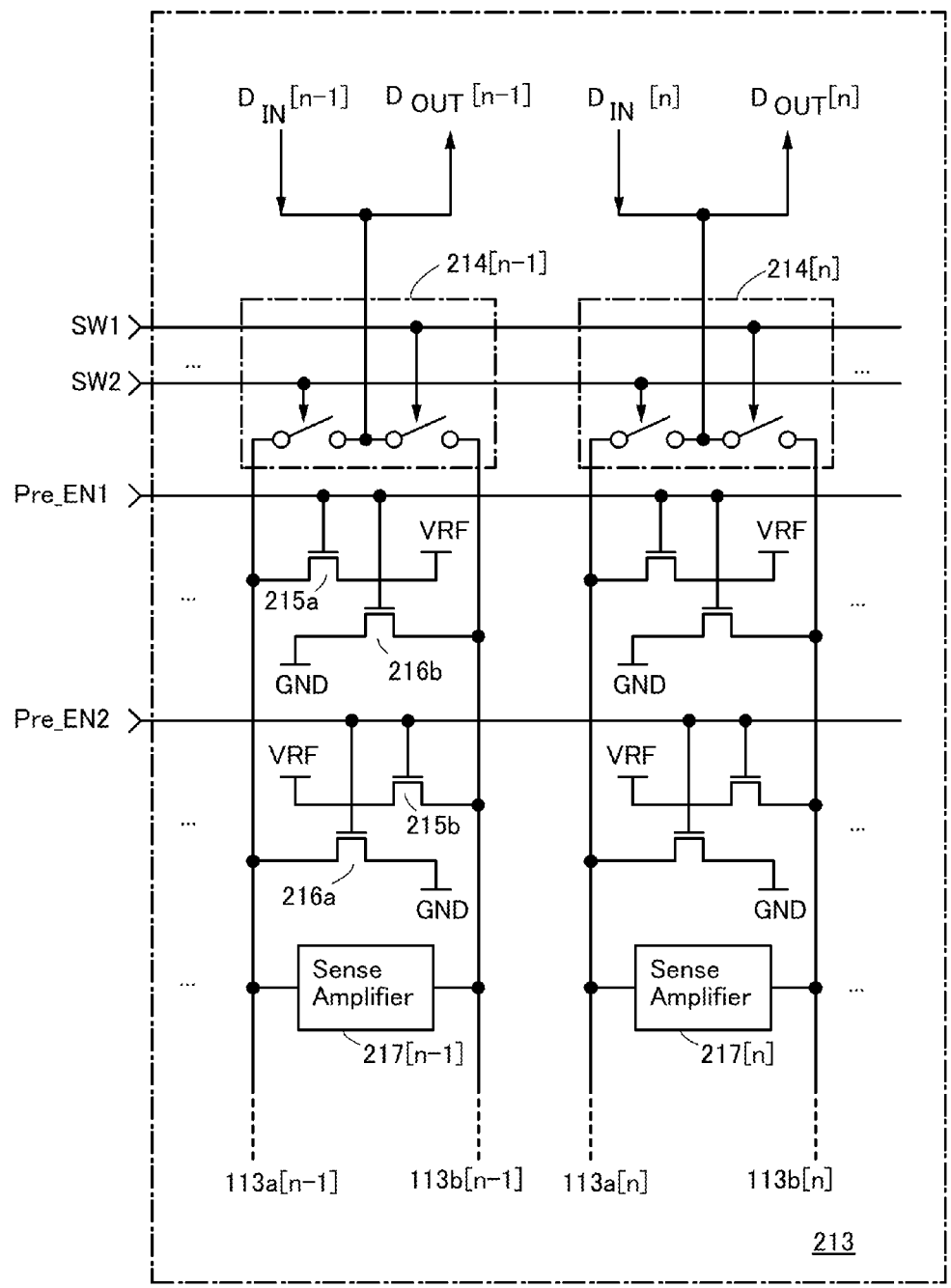
FIG. 10 is a circuit block diagram of a column driver.

FIG. 10 is a block diagram illustrating a structure example of the column driver 213 described with reference to FIG. 9. The column driver 213 illustrated in FIG. 10 includes switch circuits 214, transistors 215a, transistors 215b, transistors 216a, transistors 216b, and sense amplifiers 217. Although not illustrated, the column driver 213 has a function of supplying a potential appropriate for reading (corresponding to the potential VDD−α described in Embodiment 1) to the wirings 114a and 114b.

The switch circuit 214 and the transistors 215a, 215b, 216a, and 216b in each column are connected to one or both of the wirings 113a and 113b. The sense amplifier 217 is connected to both of the wirings 113a and 113b.

The switch circuit 214 is a circuit that has functions of controlling the conduction between the wiring 113a and a circuit for inputting and outputting data (not shown) and/or the conduction between the wiring 113b and the circuit for inputting and outputting data (not shown) and bringing the wiring 113a or the wiring 113b into an electrically floating state. For example, the switch circuit 214 includes analog switches and inverters and enables data $D_{IN}$ to be input to the wiring 113a or 113b, enables data $D_{OUT}$ to be output from the wiring 113a or 113b, or brings one or both of the wirings 113a and 113b into an electrically floating state by control by a switch control signal SW1 and a switch control signal SW2.

The transistors 215a and 215b have a function of supplying the reference potential VRF to the wirings 113a and 113b, respectively. The transistors 216a and 216b have a function of supplying the potential GND to the wirings 113a and 113b, respectively.

As the reference potential VRF, for example, the average of the potential VDD and the potential GND (hereinafter, referred to as VDD/2), the sum of the potential GND and the difference between the potential VDD and the potential GND that is divided by N (=GND+(VDD−GND)/N, (N=3, 4, 5, ...) (hereinafter, referred to as VDD/N), or the like can be used. As the potential VDD−α that is appropriate for reading, a potential that satisfies the conditions of Embodiment 1 and is higher than the reference potential VRF, such as VDD/N, can be used. For example, VDD/4 may be used as the reference potential VRF, and VDD/2 may be used as the potential VDD−α.

Control by a precharge control signal Pre_EN1 or a precharge control signal Pre_EN2 enables the reference potential VRF to be supplied to one of the wirings 113a and 113b and the potential GND to be supplied to the other. Note that the precharge control signal Pre_EN1 and the precharge control signal Pre_EN2 do not become active at the same time.

For example, when the precharge control signal Pre_EN1 is active, the wiring 113a is precharged to the reference potential VRF and the wiring 113b is precharged to the potential GND. In contrast, when the precharge control signal Pre_EN2 is active, the wiring 113a is precharged to the potential GND and the wiring 113b is precharged to the reference potential VRF.

After completion of the precharging, the precharge control signal Pre_EN1 and the precharge control signal Pre_EN2 becomes inactive, whereby the transistors 215a, 215b, 216a, and 216b are turned off, and the wirings 113a and 113b are brought into an electrically floating state.

The sense amplifier 217 has a function of amplifying the potential difference between the wirings 113a and 113b. In the case where the power supply potentials of the sense amplifier 217 are VDD and GND, the potential of one of the wirings 113a and 113b is VDD and the potential of the other is GND after the amplification.

(Specific Example of Driving Method of the Semiconductor Device 220)

An example of a driving method of the semiconductor device 220 is described with reference to FIG. 11. FIG. 11 shows the potential changes of the wiring 111[m], the wiring 115[m], the wiring 113a[n], the wiring 113b[n], the wiring 114[n-1/n], and the node 104[m,n] in the memory cell 110a[m,n] in the m-th row and the n-th column and the states of the switch control signals SW1 and SW2 and the precharge control signals Pre_EN1 and Pre_EN2. Note that the reference potential VRF is VDD/4.

A little before Time T1, the switch control signal SW1 becomes active (potential: VDD), so that a circuit for inputting data (not illustrated) is connected to the wiring 113a in the memory cell array 211a. The wiring 113a[n] becomes at a potential corresponding to data. Note that in the drawing, the potential of the wiring 113b[n] is GND at Time T1, but at this point, the wiring 113b[n] tends to be in a floating state and the actual potential of the wiring 113b[n] tends to be a potential between VDD and GND because of leakage current or the like from a transistor connected thereto.

After that, the row driver 212 selects the wiring 111[m], and during Time T1 to Time T2, the transistor 101 is turned on, and data is written to the memory cell 110a[m,n].

Then, during Time T3 to Time T4, the semiconductor device 220 is in a standby period, and in the case where data "0" has been written to the memory cell 110a[m,n], the potential of the node 104[m,n] is lowered to VDD−ΔV.

After the standby period, data reading from the memory cell 110a[m,n] is performed. First, the wiring 113a[n] and the wiring 113b[n] are precharged to GND and VDD/4, respectively. In order to precharge the wirings, the precharge control signal Pre_EN1 is made active (potential: VDD). Further, in this example, the potential of the wiring 114 is VDD/2. Note that Vth+$ΔV_{MAX}$<VDD/2.

After completion of the precharging, the row driver 212 selects the wiring 115[m], and from Time T5, the transistor 105 is turned on. When the potential of the node 104[m,n] is GND, the potential of the wiring 113a[n] becomes VDD/2. In contrast, when the potential of the node 104[m,n] is VDD−ΔV, the potential of the wiring 113a[n] remains GND.

Then, the potential difference between the wiring 113a[n] and the wiring 113b[n] is amplified by the sense amplifier 217, and after completion of the amplification, the switch control signal SW2 is made active (potential: VDD), and the wiring 113b[n] is connected to a circuit that outputs data so that data is extracted.

In the case where data "1" has been input, the potential of the node 104[m,n] is GND, and the potential of the wiring 113a[n] before the amplification is VDD/2, which is higher than VDD/4, the potential of the wiring 113b[n]. Thus, by the amplification, the potential of the wiring 113a[n] is increased to VDD. In contrast, the potential of the wiring 113b[n] is lowered to GND. Accordingly, the read data is GND, which is the same as the initial potential.

In the case where data "0" has been input, the potential of the node 104[m,n] is VDD−ΔV, and the potential of the wiring 113a[n] before the amplification is GND, which is lower than VDD/4, the potential of the wiring 113b[n]. Thus, by the amplification, the potential of the wiring 113a[n] remains GND, whereas the potential of the wiring 113b[n] is increased to VDD. Accordingly, the read data is VDD, which is the same as the initial potential.

In the above example, since data of the memory cell 110a in the memory cell array 211a is read, the precharge control signal Pre_EN2 is never active. In the case where data of the memory cell 110a in the memory cell array 211b is read, the precharge control signal Pre_EN2 becomes active.

In the above example, VDD/4 is used as the reference potential VRF and VDD/2 is used as the potential of the wiring 114. For stable amplification, the reference potential VRF is preferably higher than the potential of the wiring 114 by 0.2 V or more. Further, the potential of the wiring 114 is preferably higher than GND by 0.2 V or more.

In such a manner, the semiconductor device 220 can be operated. The arrangement of the wirings 113a[n] and 113b[n] is so-called open-bit arrangement in FIG. 9, but may be folded-bit arrangement. In general, with folded-bit arrangement, adverse effects of noise can be cancelled; thus, incorrect data reading can be further reduced.

The driving method of the semiconductor device 220 is not limited to the above method. The structure described in this embodiment can be used in appropriate combination with the structure described in any of the other embodiments.

Embodiment 4

Figure 12A:
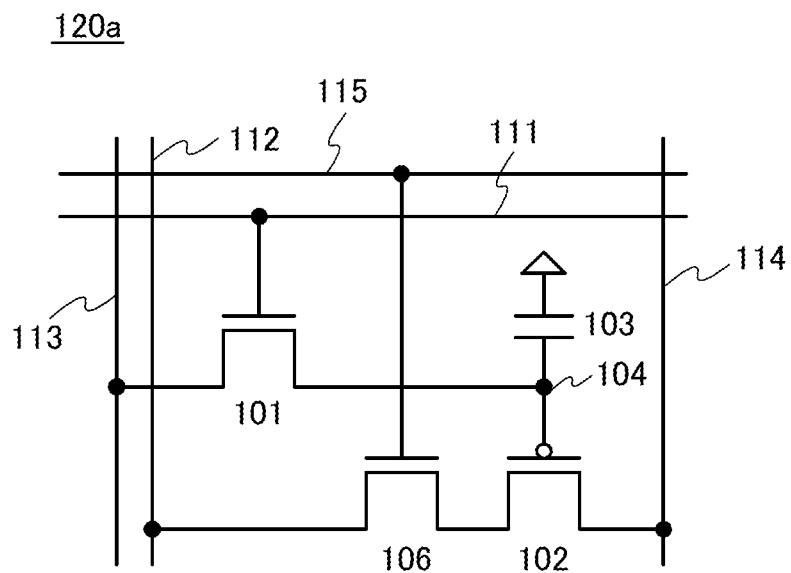
FIGS. 12A and 12B are each a circuit diagram of a memory cell.

FIG. 12A illustrates a memory cell 120a. The memory cell 120a includes the transistor 101, the transistor 102, the capacitor 103, and a transistor 106. The memory cell 120a differs from the memory cell 100a (FIG. 1A) in that the transistor 106 that corresponds to the transistor 105 is an n-channel transistor. With the n-channel transistor, the response speed can be improved or higher integration can be achieved.

Figure 12B:
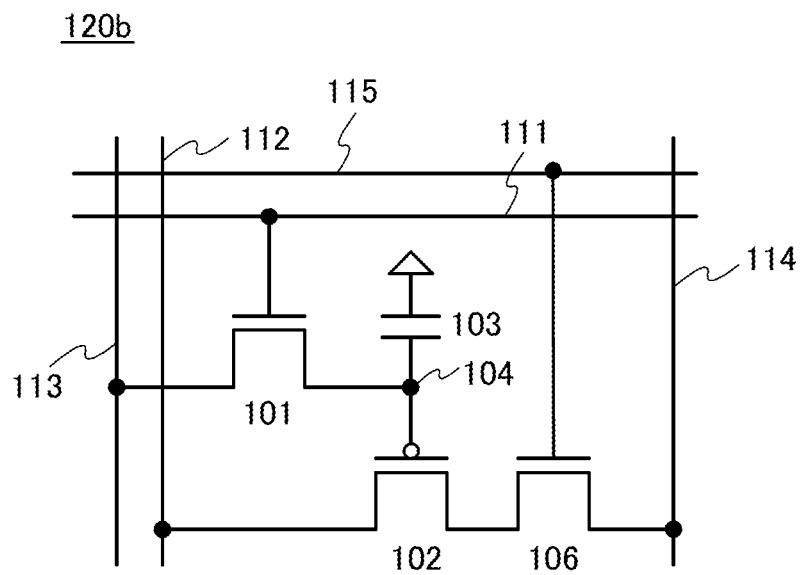

As in a memory cell 120b of FIG. 12B, the transistor 106 may be provided between the transistor 102 and the wiring 114. In the memory cell 120b, one of a source and a drain of the transistor 106 is electrically connected to the wiring 114, and the other of the source and the drain of the transistor 106 is electrically connected to one of a source and a drain of the transistor 102.

As described in Embodiment 1, the wiring 114 may be shared by two memory cells 120a. Alternatively, the wiring 114 may be shared by three or more memory cells. The wiring 114 does not have to be parallel to the wiring 112. The wiring 114 and the wiring 112 may intersect each other at right or other angles or be provided in matrix.

Operation for writing data to the memory cell 120a and operation for reading data from the memory cell 120a are described below with reference to FIG. 13. The contents described in Embodiments 1 to 3 are omitted in some cases.

(Writing Operation)

From Time T1, the potential of the wiring 111 is increased to $V_{OS\_H}$, whereby the transistor 101 is turned on. The wiring 113 becomes at a potential corresponding to data. Here, the potential of the wiring 113 is set to GND when data "1" is written and is set to VDD when data "0" is written. As a result, the node 104 becomes at a potential corresponding to data. For example, when data "1" is written, the potential of the node 104 becomes GND, and when data "0" is written, the potential of the node 104 becomes VDD. At Time T2, the potential of the wiring 111 starts to decrease, so that the transistor 101 is turned off, and writing is finished.

In writing, the wirings 112, 114, and 115 may have any potentials; however, a potential at which current does not flow between the wirings 112 and 114 is preferable. Here, the wiring 112 is GND, the wiring 114 is VDD−α, and the wiring 115 is GND. Note that α is the same as the one described in Embodiment 1.

(Retaining Operation)

The transistor 101 is turned off. As described in Embodiment 1, in the case where the potential decrease of the node 104 is largest, the potential of the node 104 in the period in which data retention is assured becomes VDD−ΔV$_{MAX}$.

(Reading Operation)

The potential of the wiring 115 is set to an appropriate value (here, GND), the transistor 106 is turned off, and the potential of the wiring 114 is set to VDD−α. After the wiring 112 is precharged to an appropriate potential (here, GND), the wiring 112 is brought into a floating state. Then, the potential of the wiring 115 is set to an appropriate value, so that the transistor 106 is turned on.

Here, a potential higher than VDD (VDDH) may be used as the potential of the wiring 115. The potential of the source and the drain of the transistor 106 is VDD−α as described above; thus, if α is greater than the threshold value of the transistor 106, the potential of the wiring 115 may be VDD. In general, in the case where VDD is sufficiently higher than the threshold value of the transistor 106, the potential of the wiring 115 can be VDD.

For example, the case where VDD=+1.8 [V], GND=0 [V], Vth=−0.5 [V], and ΔV$_{MAX}$=1.2 [V] is described in Embodiment 1. In that case, α is greater than 0.7 [V]; accordingly, if the threshold value of the transistor 106 is lower than or equal to +0.7 [V], the potential of the wiring 115 can be VDD.

In the case where data "1" has been written, the potential of the node 104 is close to GND; thus, the transistor 102 is on and the potential of the wiring 112 is VDD−α. In the case where data "0" has been written, the transistor 102 is off and the potential of the wiring 112 is hardly changed.

Figure 14A:
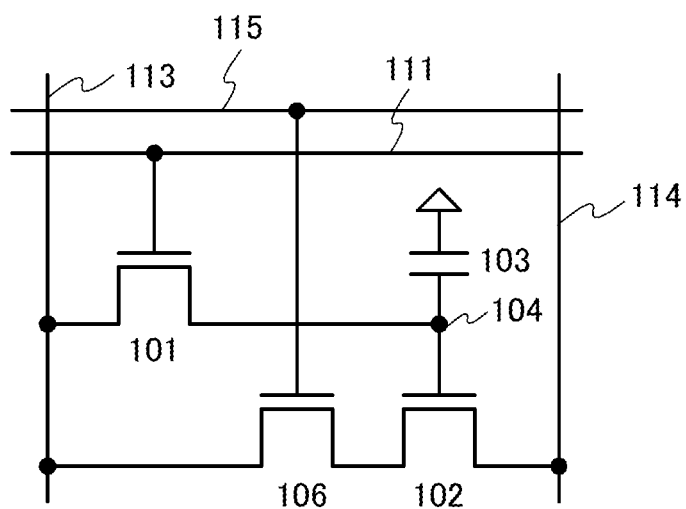
FIGS. 14A and 14B are each a circuit diagram of a memory cell.
Figure 14B:
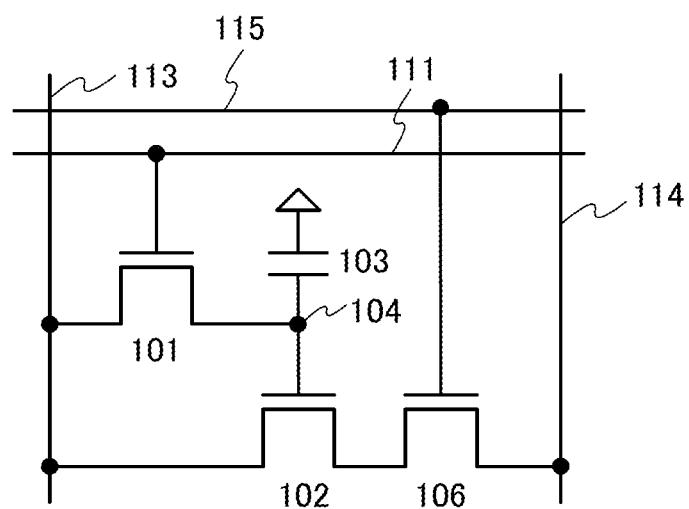

As in a memory cell 130a of FIG. 14A and a memory cell 130b of FIG. 14B, the wiring 113 can also serve as the wiring 112. The operation method is the same as that of the memory cell 120a, and thus the description thereof is omitted.

Embodiment 5

Figure 15A:
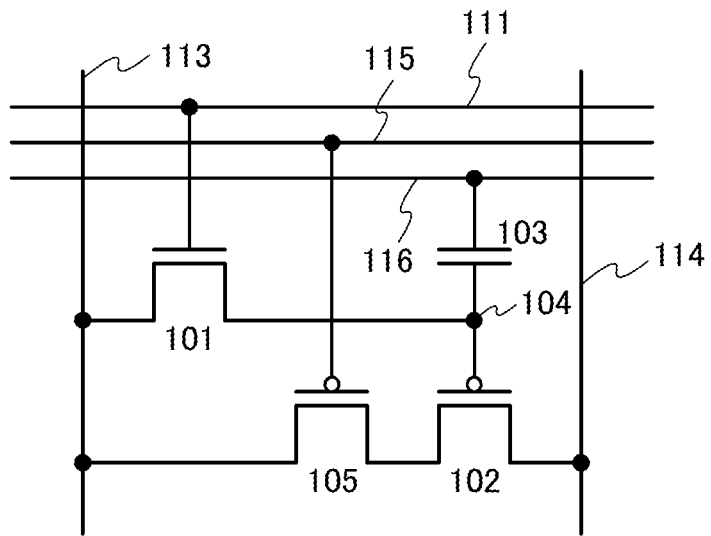
FIGS. 15A and 15B are each a circuit diagram of a memory cell.

FIG. 15A illustrates a memory cell 140a. The memory cell 140a includes the transistor 101, the transistor 102, the capacitor 103, and the transistor 105.

The transistor 101 includes an oxide semiconductor film in its channel formation region. The transistor 101 is an n-channel or p-channel transistor. The following description is made on the case where the transistor 101 is an n-channel transistor.

A gate of the transistor 101 is electrically connected to the wiring 111. The wiring 111 can function as a write word line. In the case where the transistor 101 is a thin film transistor, gate electrodes may be provided under and over its thin film semiconductor layer. Further, one of the gate electrodes may be always kept at a constant potential.

One of a source and a drain of the transistor 101 is electrically connected to the wiring 113. The wiring 113 can function as a bit line.

The other of the source and the drain of the transistor 101 is electrically connected to one electrode of the capacitor 103. The other electrode of the capacitor 103 is electrically connected to a wiring 116. The other of the source and the drain of the transistor 101 is electrically connected to a gate of the transistor 102.

By changing the potential of the wiring 116, the potential of the gate of the transistor 102 (the node 104) is changed. The wiring 116 is also referred to as a capacitor line.

The transistor 102 is a p-channel transistor. Various materials such as an oxide semiconductor and silicon can be used for a channel formation region of the transistor 102. One of a source and a drain of the transistor 102 is electrically connected to one of a source and a drain of the transistor 105. The other of the source and the drain of the transistor 102 is electrically connected to the wiring 114.

The other of the source and the drain of the transistor 105 is electrically connected to the wiring 113. A gate of the transistor 105 is electrically connected to the wiring 115. The transistor 105 is a transistor for electrically connecting the transistor 102 and the wiring 113 when data is read, and is also referred to as a selection transistor.

The wiring 114 can function as a source line or a power supply line. Although the wiring 114 is preferably retained at a constant potential, the potential may be changed when power is stopped or supplied.

Figure 15B:
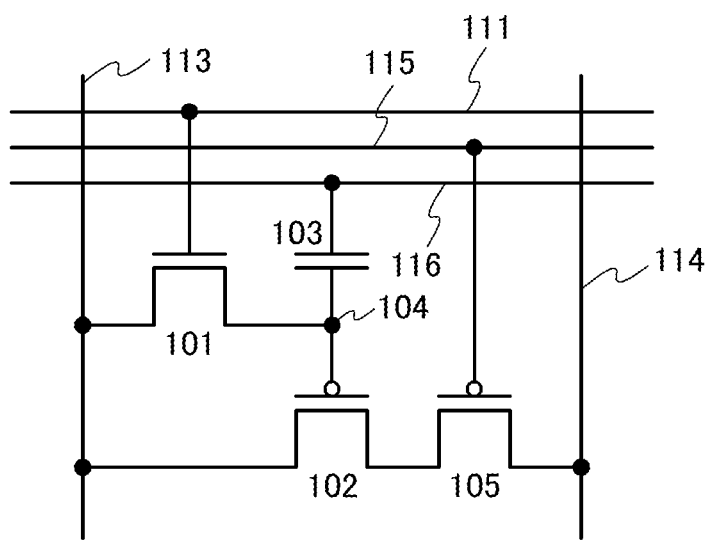

As in a memory cell 140b of FIG. 15B, the transistor 105 may be positioned between the transistor 102 and the wiring 114.

In the memory cell 140a in FIG. 15A, data is retained as the potential of the node 104. If the transistor 101 has sufficiently high off-state resistance, data can be retained for a very long period.

Operation for writing data to the memory cell 140a and operation for reading data from the memory cell 140a are described below with reference to FIG. 16. The threshold values of the transistors 102 and 105 are each lower than 0 and higher than −VDD.

(Writing Operation)

The transistor 101 is different from the transistors 102 and 105 in the threshold value or the like; thus, here, when the transistor 101 is turned on, the potential of its gate (the potential of the wiring 111) is set to $V_{OS\_H}$, and when the transistor 101 is turned off, the potential of its gate set to $V_{OS\_L}$. Note that $V_{OS\_L}$ may be equal to GND (<VDD).

Here, when data "1" is written, the potential of the wiring 113 is set to GND, and when data "0" is written, the potential of the wiring 113 is set to VDD. At Time T1 in FIG. 16, the potential of the wiring 111 starts to increase, so that the transistor 101 is turned on. As a result, the node 104 becomes at a potential corresponding to data. For example, when data "1" is written, the potential of the node 104 becomes GND, and when data "0" is written, the potential of the node 104 becomes VDD. At Time T2, the potential of the wiring 111 starts to decrease, so that the transistor 101 is turned off, and writing is finished. When the transistor 101 is turned off, the potential of the node 104 is slightly lowered by capacitive coupling between the gate of the transistor 101 (and the wiring 111) and the node 104.

In writing, it is preferable that current do not flow between the wirings 113 and 114. For example, the wirings 113 and 114 may have no potential difference. That is, as in the case of the wiring 113, the potential of the wiring 114 may be changed in accordance with data.

In a more effective method, the potential of the wiring 115 is set to a potential at which the transistor 105 is turned off. The potentials of the wirings 113 and 114 are each higher than or equal to GND and lower than or equal to VDD. Accordingly, when the potential of the wiring 115 is set to VDD, the transistor 105 is turned off. The potential of the wiring 114 remains VDD except in the standby period in this embodiment, but may be another potential.

(Retaining Operation)

When data is retained, the transistor 101 is turned off. In FIG. 16, a period in which data is retained while power supply is stopped (standby period) is from Time T3 to Time T4. In the standby period, all the wirings have the same potential (here, GND). In the case where the potential of the node 104 is higher than GND at this time, the potential of the node 104 is gradually lowered.

In the case where data "1" has been written, the potential of the node 104 is close to GND; thus, its change does not become a significant problem. In contrast, in the case where data "0" has been written, the potential of the node 104 is close to VDD at first, but is lowered over time. The potential decrease is ΔV. Under the above conditions, the potential is lowered by approximately 10% in the case where the retention period is about one year, but is lowered to 35% of the initial potential after ten years as described above. In other words, ΔV=0.65×VDD. Here, in the case where the potential decrease of the node 104 is largest, the potential of the node 104 after the period in which data retention is assured becomes VDD−$\Delta V_{MAX}$.

(Reading Operation)

Data reading operation is performed by setting the potentials of the wiring 113 and the wiring 114 to different potentials, turning on the transistor 105, and determining whether current flows between the source and the drain of the transistor 102. Depending on the potential of the node 104, the conduction state of the transistor 102 varies, so that written data can be determined.

Specifically, the potential of the wiring 115 is set to an appropriate value (here, VDD), the transistor 105 is turned off, and the potential of the wiring 114 is set to VDD. After the wiring 113 is precharged to an appropriate potential (here, GND), the wiring 112 is brought into a floating state. Then, the potential of the wiring 116 is set to an appropriate value (here, α; note that GND<α<VDD)

In the case where data "1" has been written, although the potential of the node 104 is close to GND right before this time, owing to the increase of the potential of the wiring 116 from GND to α, the potential of the node 104 becomes almost α because of capacitive coupling through the capacitor 103. In the case where data "0" has been written, the potential of the node 104 becomes almost VDD−ΔV+α−GND. After that, the potential of the wiring 115 is set to an appropriate value (here, GND) at Time T5 to turn on the transistor 105.

In order that data is read correctly, in the case where data "1" has been written, it is required that the transistor 102 is on and the potential of the wiring 113 increases from GND to VDD; in the case where data "0" has been written, it is required that the transistor 102 is off and the potential of the wiring 113 remains GND.

To fulfill the requirements, it is needed to satisfy the following two inequalities when the threshold value of the transistor 102 is Vth: α<VDD+Vth and VDD−ΔV+α−GND≥VDD+Vth. That is, GND+ΔV+Vth≤GND+$\Delta V_{MAX}$+Vth≤α<VDD+Vth.

For example, 0.7 [V]≤α<1.3 [V] is satisfied when VDD=+1.8 [V], GND=0 [V], Vth=−0.5 [V], and $\Delta V_{MAX}$=1.2 [V]. Alternatively, 0.2 [V]≤α<0.5 [V] is satisfied when VDD=+0.9 [V], GND=0 [V], Vth=−0.4 [V], and $\Delta V_{MAX}$=0.6 [V].

Note that α can be a given value in the required range, and α may be the average of VDD and GND (also referred to as VDD/2) or the sum of GND and the difference between VDD and GND that is divided by N (also referred to as VDD/N;

note that N=3, 4, 5, . . . ). In the former case, VDD/2 is 0.9 [V]. In the latter case, VDD/3 is 0.3 [V]. Both values are in the required range.

As described above, in the case where the potential of the node 104 is lowered from the initial potential by greater than or equal to 60% (in the case where the potential of the node 104 is lowered to less than or equal to 40% of the initial potential) in the standby period, the potential of the node 104 is preferably increased by increasing the potential of the wiring 116 as appropriate in reading.

Note that although the written potential is initially VDD in the case of data "0", the potential output to the wiring 116 is GND. It needs to be noted that inverted data is output like this.

Figure 17:
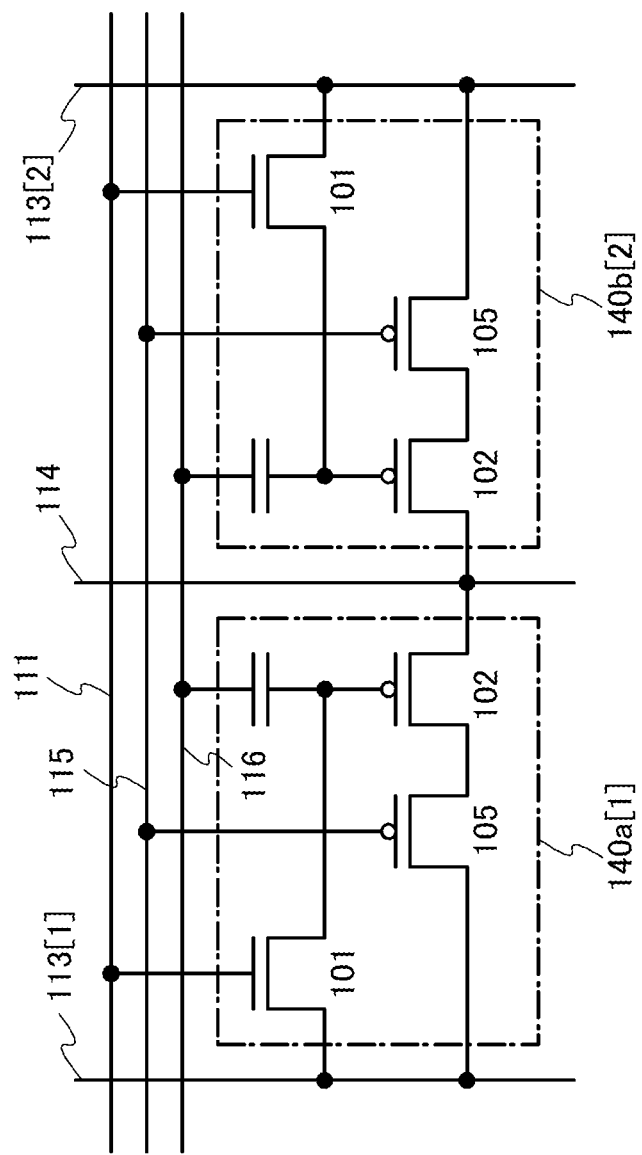
FIG. 17 is a circuit diagram of a memory cell.

Although it is apparent from the above description, as illustrated in FIG. 17, the wiring 114 may be shared by two memory cells 140a[1] and 140a[2]. Alternatively, the wiring 114 may be shared by three or more memory cells. The wiring 114 does not have to be parallel to the wiring 113. The wiring 114 and the wiring 113 may intersect each other at right or other angles or be provided in matrix.

Embodiment 6

Figure 18A:
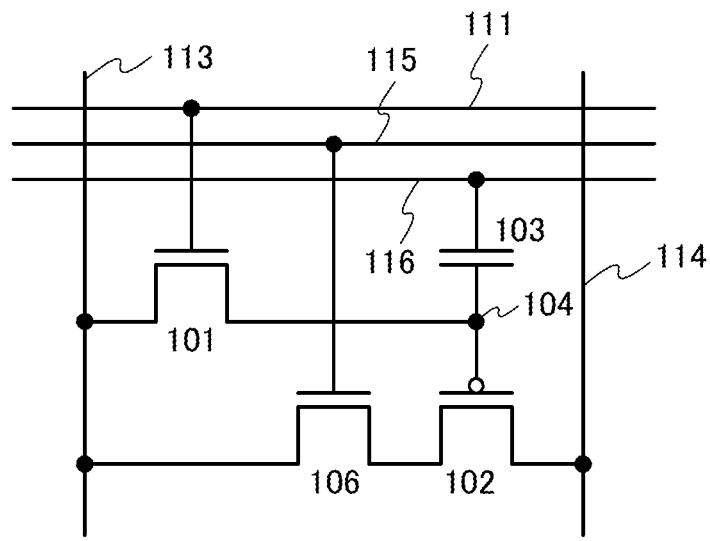
FIGS. 18A and 18B are each a circuit diagram of a memory cell.

FIG. 18A illustrates a memory cell 150a. The memory cell 150a includes the transistor 101, the transistor 102, and the capacitor 103. These are the same as those described in Embodiment 5. The memory cell 150a includes the n-channel transistor 106 instead of the transistor 105 in the memory cell 140a in Embodiment 5. With the n-channel transistor, the response speed can be improved or higher integration can be achieved.

Figure 18B:
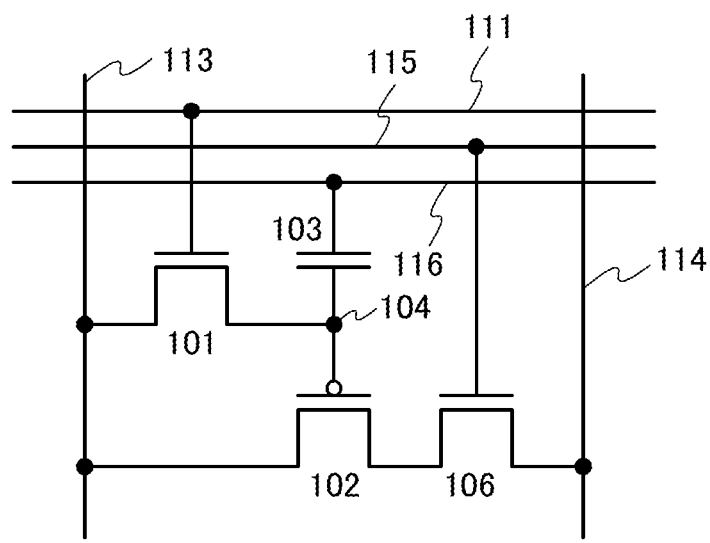

As in a memory cell 150b of FIG. 18B, the transistor 106 may be arranged between the transistor 102 and the wiring 114. In the memory cell 150b, one of a source and a drain of the transistor 106 is electrically connected to the wiring 114, and the other of the source and the drain of the transistor 106 is electrically connected to one of a source and a drain of the transistor 102.

Figure 19:
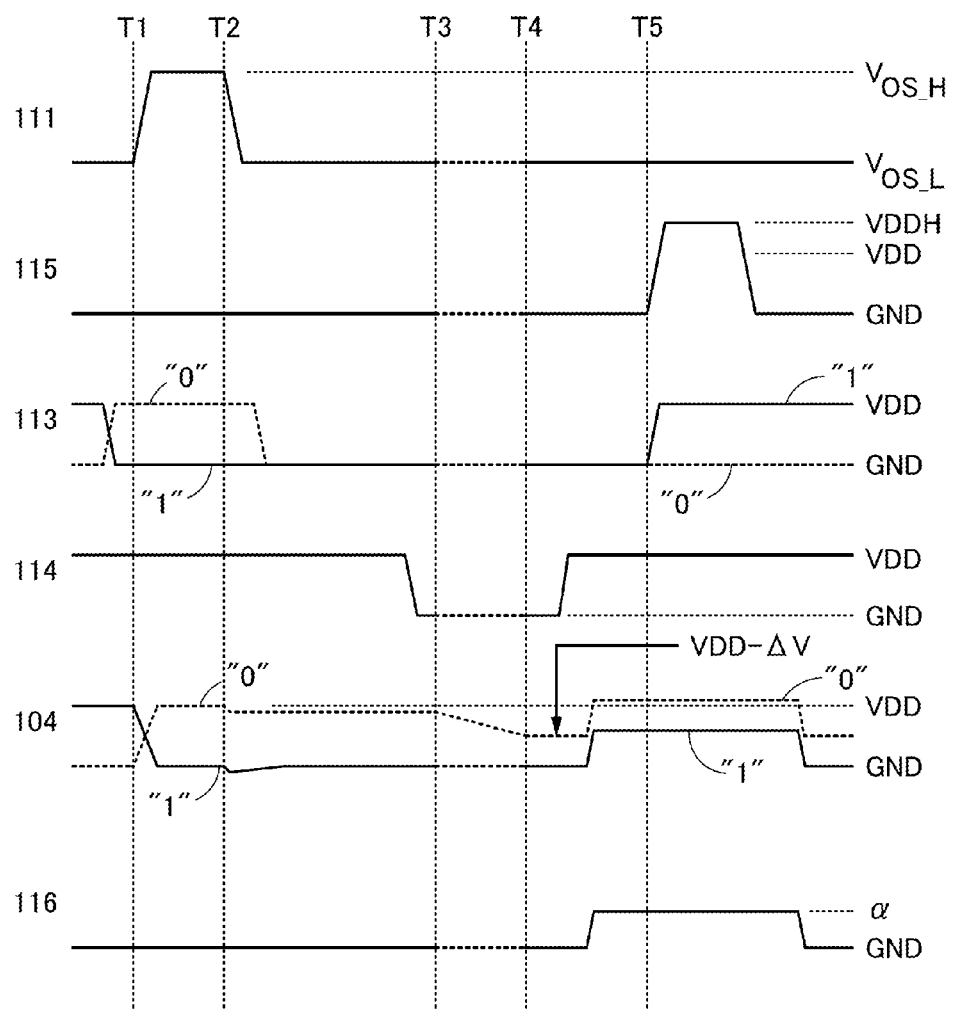
FIG. 19 is a timing chart.

Operation for writing data to the memory cell 150a and operation for reading data from the memory cell 150a are described below with reference to FIG. 19. The threshold value of the transistor 102 is lower than 0 and higher than −VDD. The threshold value of the transistor 106 is higher than 0. Detailed description of the same operations as those in Embodiment 1 is omitted in some cases.

(Writing Operation)

From Time T1, the potential of the wiring 111 is increased to $V_{OS\_H}$, whereby the transistor 101 is turned on. The potential of the wiring 113 is GND or VDD. As in Embodiment 1, the potential of the wiring 113 is set to GND when data "1" is written and is set to VDD when data "0" is written. In Time T2, the potential of the wiring 111 decreases, so that the transistor 101 is turned off, and writing is finished.

In writing, the wirings 114, 115, and 116 may have any potentials; however, a potential at which current does not flow between the wirings 113 and 114 is preferable. Here, the wiring 113 is GND, the wiring 114 is VDD, and the wiring 115 is GND.

(Retaining Operation)

The transistor 101 is turned off. In FIG. 19, a standby period is from Time T3 to Time T4. In the standby period, all the wirings have the same potential (here, GND). As described in Embodiment 1, in the case where the potential decrease of the node 104 is largest, the potential of the node 104 in the period in which data retention is assured becomes VDD−$\Delta V_{MAX}$.

(Reading Operation)

The potential of the wiring 115 is set to an appropriate value (here, GND), the transistor 106 is turned off, and the potential of the wiring 114 is set to VDD. After the wiring 113 is precharged to an appropriate potential (here, GND), the wiring 113 is brought into a floating state. Then, after the potential of the wiring 116 is set to a described in Embodiment 1, the potential of the wiring 115 is set to an appropriate value, and then the transistor 106 is turned on.

As the potential of the wiring 115 at this time, a potential higher than VDD (VDDH) may be used. When the threshold value of the transistor 106 is $Vth_{106}$, it is preferable to satisfy VDDH>VDD+$Vth_{106}$. Note that VDDH may be equal to $V_{OS\_H}$.

The structure described in this embodiment can be used in appropriate combination with the structure described in any of the other embodiments.

Embodiment 7

In this embodiment, an example of a semiconductor device to which the memory cells described in FIGS. 15A and 15B, FIG. 17, and FIGS. 18A and 18B can be applied is described with reference to FIG. 7B and FIG. 20.

(Configuration Example of Semiconductor Device 230)

Figure 20:
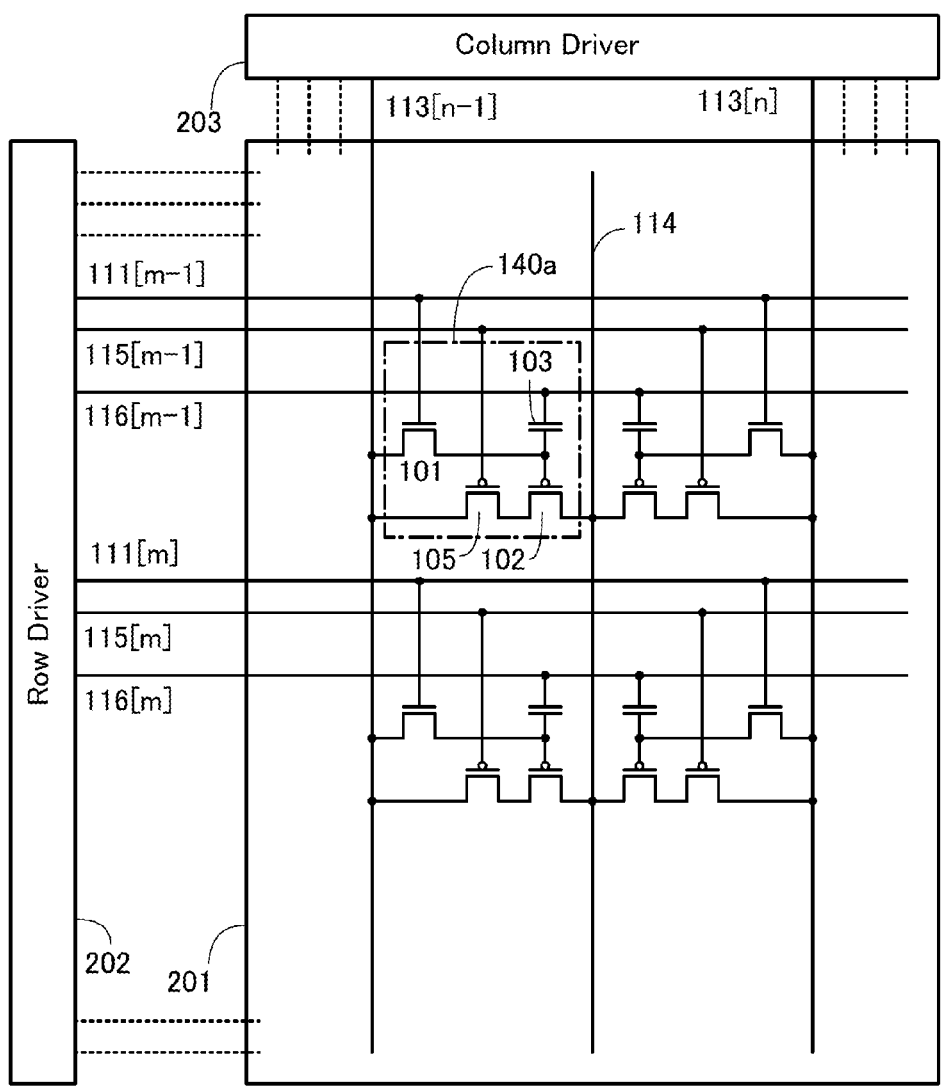
FIG. 20 is a circuit block diagram of a semiconductor device.

FIG. 20 is a block diagram of a configuration example of a semiconductor device 230 including the memory cell 140a described with reference to FIG. 15A.

The semiconductor device 230 illustrated in FIG. 20 includes the memory cell array 201 in which the memory cells 140a described with reference to FIG. 15A are provided in matrix, the row driver 202, and the column driver 203. FIG. 20 illustrates, as the wirings 111, 113, 115, and 116, the wiring 111[m−1], the wiring 115[m−1], and the wiring 116[m−1] in the (m−1)-th row; the wiring 111[m], the wiring 115[m], the wiring 116[m] in the m-th row; the wiring 113[n−1] in the (n−1)-th column; and the wiring 113[n] in the n-th column.

Components of the memory cells 140a are similar to those of the memory cell shown in FIG. 15A; thus, the description of FIG. 15A can be referred to.

The row driver 202 is a circuit that has functions of selectively turning on the transistors 101 and 105 in each row of the memory cells 140a and selectively changing the potential of the node 104 in each row of the memory cells 140a. Specifically, the row driver 202 is a circuit that supplies signals to the wirings 111, 115, and 116. With the row driver 202, the semiconductor device 230 can perform data writing to and data reading from the memory cells 140a by selecting the memory cells 140a row by row.

The column driver 203 is a circuit that has functions of precharging the wiring 113 in the memory cell 140a, bringing the wiring 113 into an electrically floating state, supplying a potential corresponding to data to the wiring 113, and outputting, to the outside, the potential of the wiring 113 that corresponds to data retained in the memory cell 140a. With the column driver 203, the semiconductor device 230 can perform data writing to and data reading from the memory cells 140a.

Figure 7B:
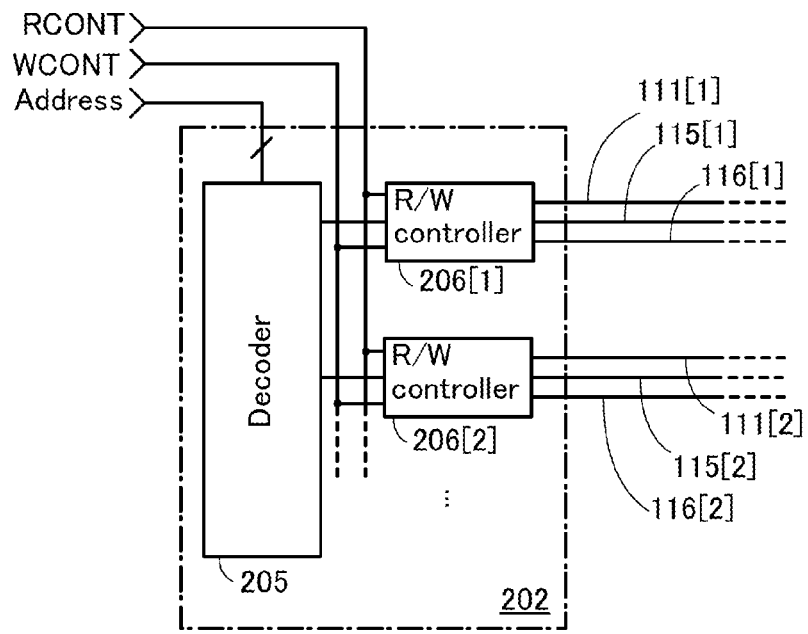

FIG. 7B is a block diagram illustrating a configuration example of the row driver 202 described with reference to FIG. 20.

The row driver 202 illustrated in FIG. 7B includes the decoder 205 and the controllers 206. The controllers 206 are provided for each row. The controller 206[1] is provided in the first row, and the controller 206[2] is provided in the second row. The controller 206 in each row is connected to the wirings 111, 115, and 116.

The decoder 205 is a circuit that has a function of outputting a signal for selecting the row corresponding to an address signal (Address).

The controller 206 is a circuit that has a function of outputting, to the wirings 111, 115, and 116 in the row selected by the decoder 205, signals corresponding to a write control signal WCONT or a read control signal RCONT.

Note that as the column driver, the column driver 203 in FIG. 8 described in Embodiment 3 can be used.

The structure described in this embodiment can be used in appropriate combination with the structure described in any of the other embodiments.

Embodiment 8

An oxide semiconductor that can be used for the channel of the transistor 101 in Embodiments 1 to 7 is described.

An oxide semiconductor preferably contains at least indium (In) or zinc (Zn). The oxide semiconductor preferably contains, in addition to In and Zn, gallium (Ga) serving as a stabilizer that reduces variations in electrical characteristics of the transistor using the above-described oxide semiconductor. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by sputtering or a wet process. Further, unlike silicon carbide, gallium nitride, or gallium oxide, with the use of the In—Ga—Zn-based oxide, a transistor with favorable electrical characteristics can be formed over a glass substrate. Further, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

Note that, for example, an In—Ga—Zn-based oxide means an oxide containing In, Ga, and Zn and there is no particular limitation on the ratio of In:Ga:Zn. Further, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=$\frac{1}{3}$:$\frac{1}{3}$:$\frac{1}{3}$) or In:Ga:Zn=2:2:1 (=$\frac{2}{5}$:$\frac{2}{5}$:$\frac{1}{5}$), or an oxide with an atomic ratio close to any of the above atomic ratios can be used. Alternatively, an In—Sn—Zn-based oxide with an atomic ratio of In:Sn:Zn=1:1:1 (=$\frac{1}{3}$:$\frac{1}{3}$:$\frac{1}{3}$), In:Sn:Zn=2:1:3 (=$\frac{1}{3}$:$\frac{1}{6}$:$\frac{1}{2}$), In:Sn:Zn=2:1:5 (=$\frac{1}{4}$:$\frac{1}{8}$:$\frac{5}{8}$), or an oxide with an atomic ratio close to any of the above atomic ratios can be used.

For example, with an In—Sn—Zn-based oxide, high mobility can be realized relatively easily. However, even with an In—Ga—Zn-based oxide, mobility can be increased by reducing the defect density in the bulk.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ do not appear at around 36°.

With the use of the CAAC-OS film in a transistor, variation in electrical characteristics of the transistor due to irradiation with visible light or ultraviolet light is small. Thus, the transistor has high reliability.

Note that an oxide semiconductor film may be a stacked film including two or more kinds of an amorphous oxide semiconductor film, a microcrystalline oxide semiconductor film, and a CAAC-OS film, for example.

For example, the CAAC-OS film is formed by a sputtering method with a polycrystalline metal oxide sputtering target.

For the deposition of the CAAC-OS film, the following conditions are preferably used.

By reducing the amount of impurities entering the CAAC-OS layer during the deposition, the crystal state can be prevented from being broken by the impurities. For example, the concentration of impurities (e.g., hydrogen, water, carbon dioxide, and nitrogen) that exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like or pellet-like sputtered particles reach the substrate, migration occurs on the substrate, so that a flat plane of each flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

The oxide semiconductor film is not limited to a single-layer metal oxide film and may have a stacked structure of a plurality of metal oxide films. In a semiconductor film in which first to third metal oxide films are sequentially stacked, for example, the first metal oxide film and the third metal oxide film are each an oxide film that contains at least one of the metal elements contained in the second metal oxide film and whose lowest conduction band energy level is closer to the vacuum level than that of the second metal oxide film by higher than or equal to 0.05 eV, 0.07 eV, 0.1 eV, or 0.15 eV and lower than or equal to 2 eV, 1 eV, 0.5 eV, or 0.4 eV. Further, the second metal oxide film preferably contains at least indium in order to increase the carrier mobility.

In the transistor including the above oxide semiconductor film, when a voltage is applied to the gate electrode so that an electric field is applied to the semiconductor film, a channel region is formed in the second metal oxide film whose lowest conduction band energy level is low in the semiconductor film. That is, since the third metal oxide film is provided between the second metal oxide film and the gate insulating film, a channel region can be formed in the second metal oxide film that is insulated from the gate insulating film.

Since the third metal oxide film contains at least one of the metal elements contained in the second metal oxide film, interface scattering is unlikely to occur at the interface between the second metal oxide film and the third metal oxide film. Thus, the movement of carriers is unlikely to be inhibited at the interface, which results in an increase in the field-effect mobility of the transistor.

Further, when an interface level is formed at the interface between the second metal oxide film and the first metal oxide film, a channel region is formed also in the vicinity of the interface, which causes a change in the threshold value of the transistor. However, since the first metal oxide film contains at least one of the metal elements contained in the second metal oxide film, an interface level is unlikely to be formed at the interface between the second metal oxide film and the first metal oxide film. Accordingly, the above structure allows reducing of variations in the electrical characteristics of the transistor, such as the threshold value.

Further, it is preferable that a plurality of metal oxide films be stacked so that an interface level due to an impurity existing between the metal oxide films, which inhibits carrier flow, is not formed at the interface between the metal oxide films. This is because when an impurity exists between the stacked metal oxide films, the continuity of the lowest conduction band energy level between the metal oxide films is lost, and carriers are trapped or disappear by recombination in the vicinity of the interface. By reducing an impurity existing between the films, a continuous junction (here, in particular, a U-shape well structure whose lowest conduction band energy level is changed continuously between the films) is formed more easily than the case of merely stacking a plurality of metal oxide films that share at least one main metal component.

In order to form such a continuous energy band, it is necessary to form films continuously without being exposed to air, with use of a multi-chamber deposition apparatus (sputtering apparatus) including a load lock chamber. Each chamber in the sputtering apparatus is preferably evacuated to high vacuum (approximately $5 \times 10^{-7}$ Pa to approximately $1 \times 10^{-4}$ Pa) with an entrapment vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of $-40°$ C. or lower, preferably $-80°$ C. or lower, further preferably $-100°$ C. or lower and is highly purified, moisture and the like can be prevented from entering the oxide semiconductor film as much as possible.

For example, the first metal oxide film or the third metal oxide film may be an oxide film containing aluminum, silicon, titanium, gallium, germanium, yttrium, zirconium, tin, lanthanum, cerium, or hafnium at a higher atomic ratio than the second metal oxide film. Specifically, the first metal oxide film or the third metal oxide film may be an oxide film containing the above element at an atomic ratio 1.5 times or more, preferably twice or more, and more preferably three times or more that in the second metal oxide film. The above element is strongly bonded to oxygen, and thus has a function of suppressing generation of oxygen vacancies in the oxide film. That is, oxygen vacancies are less likely to be generated in the first metal oxide film or the third metal oxide film than in the second metal oxide film.

The first metal oxide film and the third metal oxide film each have a thickness of 3 nm to 100 nm, preferably 3 nm to 50 nm. The second metal oxide film has a thickness of 3 nm to 200 nm, preferably 3 nm to 100 nm, and more preferably 3 nm to 50 nm.

In the three-layer semiconductor film, the first metal oxide film and the third metal oxide film can be amorphous or crystalline. Note that the second metal oxide film in which a channel region is formed preferably has a crystalline structure, in which case the transistor can have stable electrical characteristics.

Embodiment 9

Examples of a cross-sectional structure of any of the semiconductor devices 200, 220, and 230 described in Embodiment 3 or 7 and the transistor 101 described in Embodiments 1 to 7 are described with reference to FIGS. 21A to 21C and FIGS. 22A to 22D.

Figure 21A:
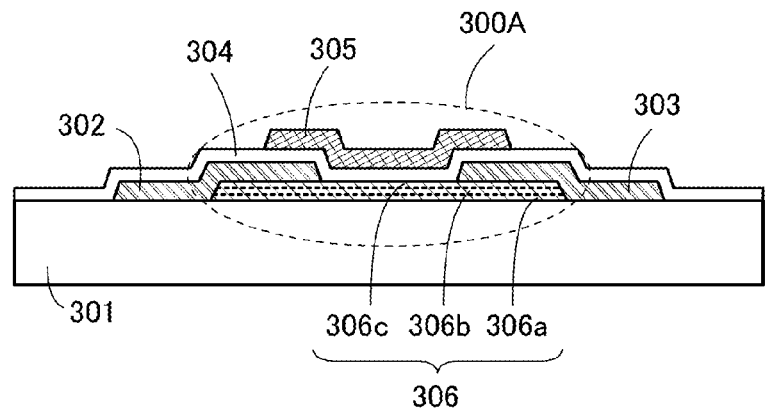
FIGS. 21A to 21C are each a cross-sectional view of a transistor.

A transistor 300A in FIG. 21A includes a semiconductor film 306 provided over an insulating film 301 and the like, conductive films 302 and 303 electrically connected to the semiconductor film 306, a gate insulating film 304, and a gate electrode 305 that is provided over the gate insulating film 304 to overlap with the semiconductor film 306.

In the transistor 300A, as the semiconductor film 306, oxide semiconductor films 306a to 306c are stacked in this order from the insulating film 301 side.

The oxide semiconductor films 306a and 306c are each an oxide film that contains at least one of the metal elements contained in the oxide semiconductor film 306b and whose lowest conduction band energy level is closer to the vacuum level than that of the oxide semiconductor film 306b by higher than or equal to 0.05 eV and lower than or equal to 2 eV, higher than or equal to 0.07 eV and lower than or equal to 1 eV, higher than or equal to 0.1 eV and lower than or equal to 0.5 eV, or higher than or equal to 0.15 eV and lower than or equal to 0.4 eV. Further, the oxide semiconductor film 306b preferably contains at least indium in order to increase the carrier mobility.

Figure 21B:
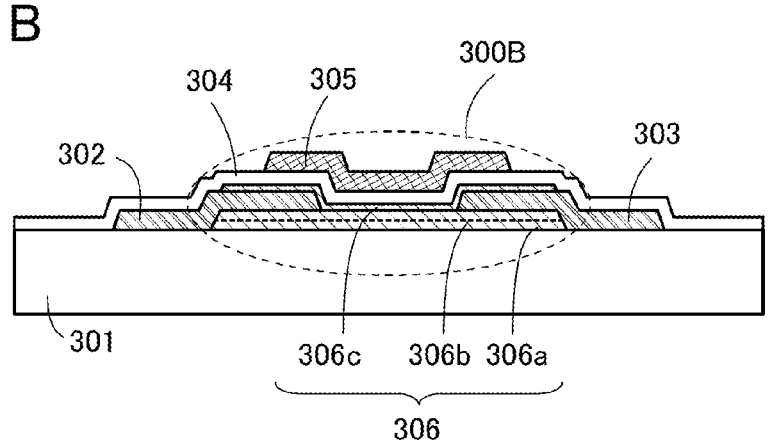

Note that as in a transistor 300B of FIG. 21B, the oxide semiconductor film 306c may be provided over the conductive films 302 and 303 to overlap with the gate insulating film 304.

Figure 21C:
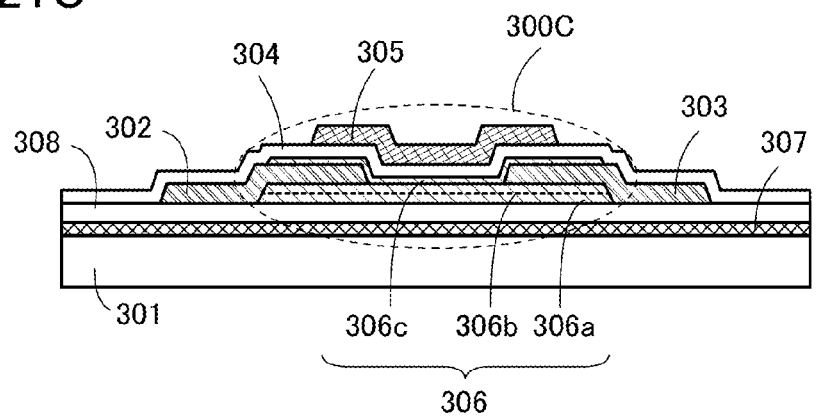

As in a transistor 300C of FIG. 21C, a second gate electrode 307 may be provided between the insulating film 301 and the oxide semiconductor film 306 with a second gate insulating film 308 interposed between the insulating film 301 and the oxide semiconductor film 306.

In the case where the transistor 300C includes the second gate electrode 307, a normal signal for controlling the on/off state may be given to the gate electrode 305 and a fixed potential may be given to the second gate electrode 307 from another component. By controlling the level of a potential applied to the second gate electrode 307, the threshold voltage of the transistor can be controlled. The same potential may be given to the gate electrode 305 and the second gate electrode 307.

The transistors 300A to 300C in FIGS. 21A to 21C each have a single-channel structure. Alternatively, the transistors 300A to 300C may each have a multi-channel structure in which a plurality of gate electrodes electrically connected to each other are provided and thus a plurality of channel formation regions are included in one active layer.

(Example of Manufacturing Process of Semiconductor Device)

An example of a manufacturing process of the semiconductor device 200 is described below with reference to FIGS. 22A to 22D. For details, Patent Document 1 may be referred to. FIGS. 22A to 22D are views for clearly illustrating the stacked structures and are not views illustrating particular cross sections.

Figure 22A:
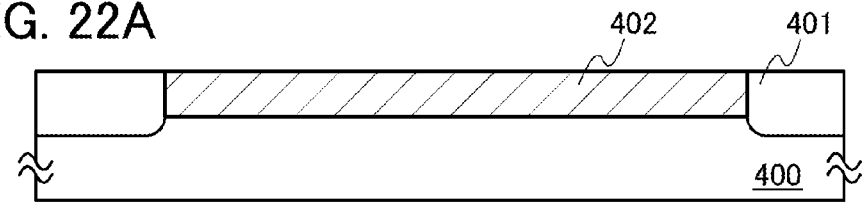
FIGS. 22A to 22D are cross-sectional views illustrating a manufacturing process of a semiconductor device.

A semiconductor substrate 400 that is single crystal, polycrystal, or amorphous is provided with an element isolation insulator 401 and an n-channel well 402 (FIG. 22A).

A first gate insulating film 403 and a first gate wiring 404 are formed, and a p-channel impurity region 405 is formed in the well 402. A material with higher conductivity such as silicide may be stacked over the impurity region. The impurity region 405 may include an extension region.

Furthermore, a first interlayer insulator 406 is provided. The first interlayer insulator 406 has a single-layer or multilayer structure and preferably has a capability of supplying oxygen to an upper layer and a property of preventing hydrogen and water from moving from a lower layer to an upper layer. Then, the first interlayer insulator 406 is planarized and etched at the same time. The etching is stopped when the first gate wiring 404 is exposed.

Figure 22B:
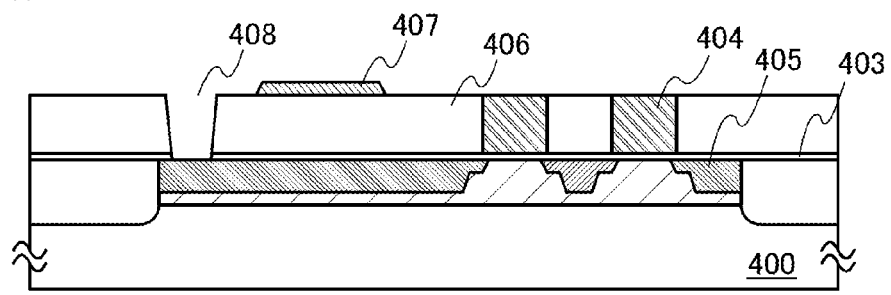

An oxide semiconductor film 407 is formed over the first interlayer insulator 406. Note that a semiconductor other than an oxide semiconductor may be used for the oxide semiconductor film 407; for example, a silicon film having a thickness of 2 nm or less may be used. Furthermore, a contact hole 408 is formed in the first interlayer insulator 406 (FIG. 22B).

A conductive material is deposited to fill the contact hole 408. At this time, the oxide semiconductor film 407 is covered with the conductive material. The conductive material has a single-layer or multilayer structure. A surface of the conductive material is planarized. Then, the conductive material is selectively etched to form a first wiring 409. Note that the first wiring 409 may have a structure in which a contact plug is included in the contact hole 408. The first wiring 409 may include a multilayer conductive material.

Figure 22C:
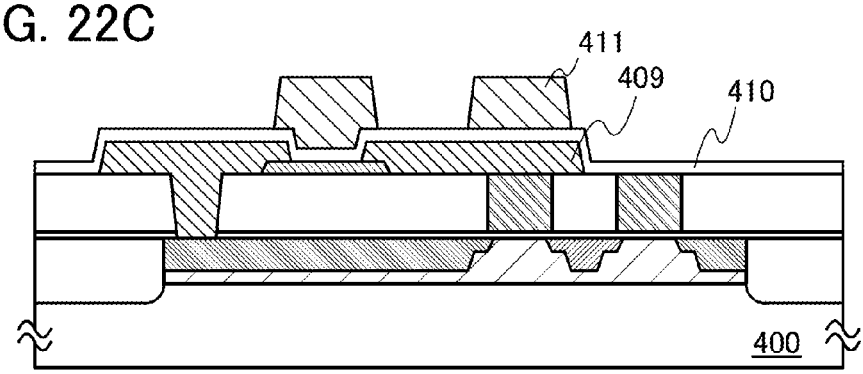

A second gate insulating film 410 is formed to cover the first wiring 409. A conductive material is deposited, and its surface is planarized. The conductive material has a single-layer or multilayer structure, and preferably has a capability of preventing hydrogen and water from moving from an upper layer to a lower layer. The conductive material having the planarized surface is selectively etched, so that a second gate wiring 411 is formed (FIG. 22C).

A second interlayer insulator 412 is deposited and its surface is planarized. Then, a contact hole reaching the first wiring 409 is formed in the second interlayer insulator 412, and then is filled with a conductive material, whereby the second wiring 413 is formed. Note that a second wiring 413 may have a structure in which a contact plug is included in the contact hole. The second wiring 413 may include a multilayer conductive material.

Figure 22D:
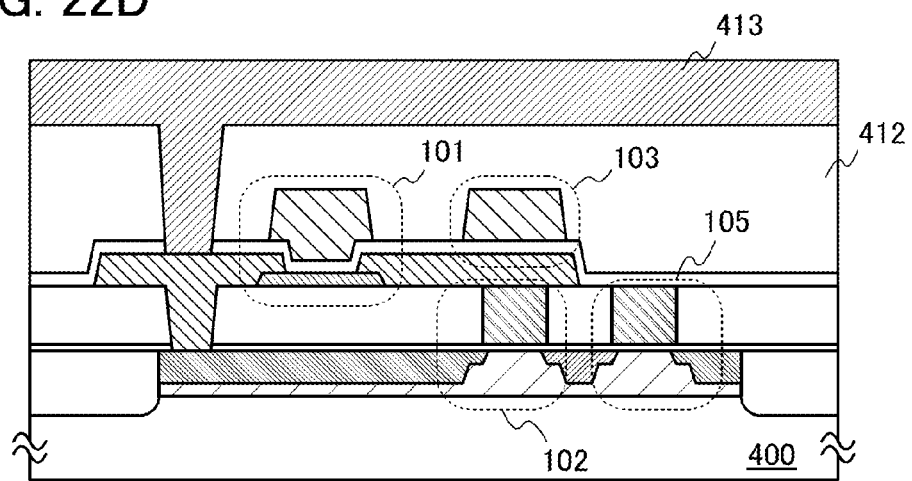

In such a manner, the transistor 101, the transistor 102, the capacitor 103, and the transistor 105 illustrated in FIG. 22D can be formed. The capacitor 103 has a structure in which the second gate insulating film 410 is positioned between the first wiring 409 and the second gate wiring 411.

Embodiment 10

The semiconductor device of one embodiment of the present invention can be used for display devices, personal computers, image reproducing devices provided with recording media (typically, devices that reproduce the content of recording media such as digital versatile discs (DVDs) and have displays for displaying the reproduced images), or the like. Other examples of electronic devices that can be equipped with the semiconductor device of one embodiment of the present invention are mobile phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 23A to 23F illustrate specific examples of these electronic devices.

Figure 23A:
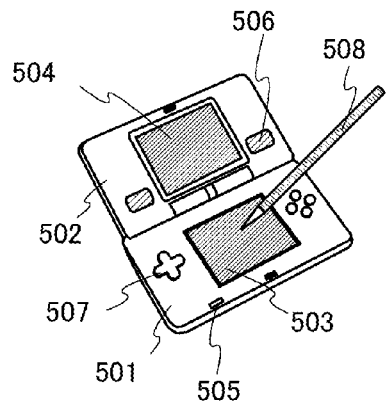
FIGS. 23A to 23F are diagrams of electronic devices.

FIG. 23A illustrates a portable game machine including a housing 501, a housing 502, a display portion 503, a display portion 504, a microphone 505, a speaker 506, an operation key 507, a stylus 508, and the like. Although the portable game machine in FIG. 23A has the two display portions 503 and 504, the number of display portions included in a portable game machine is not limited to this.

Figure 23B:
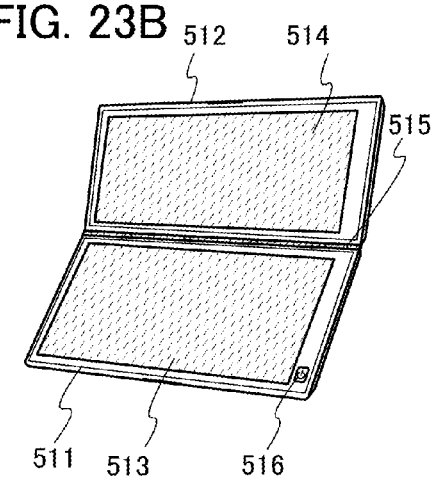

FIG. 23B illustrates a portable data terminal including a first housing 511, a second housing 512, a first display portion 513, a second display portion 514, a joint 515, an operation key 516, and the like. The first display portion 513 is provided in the first housing 511, and the second display portion 514 is provided in the second housing 512. The first housing 511 and the second housing 512 are connected to each other with the joint 515, and the angle between the first housing 511 and the second housing 512 can be changed with the joint 515. An image on the first display portion 513 may be switched depending on the angle between the first housing 511 and the second housing 512 at the joint 515. A display device with a position input function may be used as at least one of the first display portion 513 and the second display portion 514. Note that the position input function can be added by providing a touch panel in a display device. Alternatively, the position input function can be added by provision of a photoelectric conversion element called a photosensor in a pixel area of a display device.

Figure 23C:
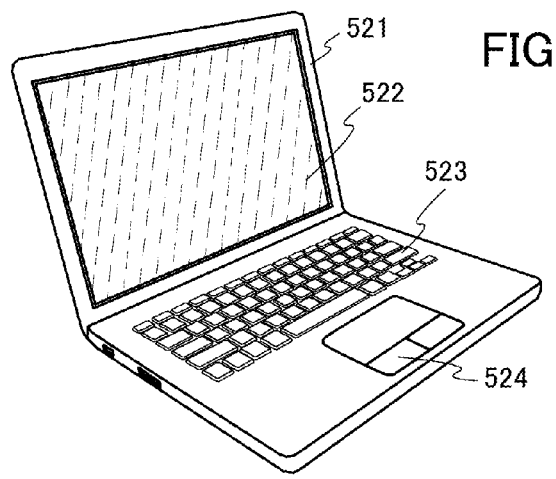

FIG. 23C illustrates a laptop personal computer, which includes a housing 521, a display portion 522, a keyboard 523, a pointing device 524, and the like.

Figure 23D:
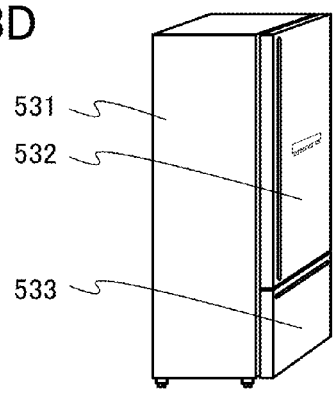

FIG. 23D illustrates the electric refrigerator-freezer including a housing 531, a door for a refrigerator 532, a door for a freezer 533, and the like.

Figure 23E:
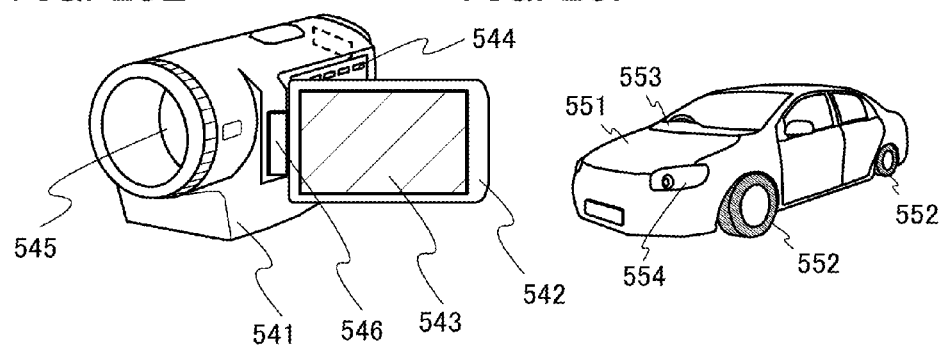

FIG. 23E illustrates a video camera, which includes a first housing 541, a second housing 542, a display portion 543, operation keys 544, a lens 545, a joint 546, and the like. The operation keys 544 and the lens 545 are provided for the first housing 541, and the display portion 543 is provided for the second housing 542. The first housing 541 and the second housing 542 are connected to each other with the joint 546, and the angle between the first housing 541 and the second housing 542 can be changed with the joint 546. Images displayed on the display portion 543 may be switched in accordance with the angle at the joint 546 between the first housing 541 and the second housing 542.

Figure 23F:
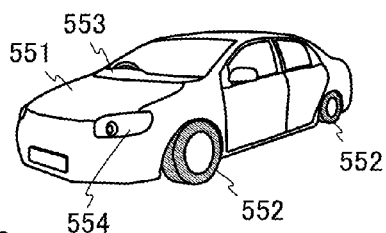

FIG. 23F illustrates a passenger car including a car body 551, wheels 552, a dashboard 553, lights 554, and the like.

This application is based on Japanese Patent Application serial no. 2013-114562 filed with Japan Patent Office on May 30, 2013 and Japanese Patent Application serial no. 2013-114564 filed with Japan Patent Office on May 30, 2013, the entire contents of which are hereby incorporated by reference.

What is claimed is:

1. A driving method of a semiconductor device including a first word line, a second word line, a first bit line, a second bit line, a first wiring, a first transistor, a second transistor, and a third transistor between the second transistor and the second bit line or between the second transistor and the first wiring, wherein a gate of the first transistor is electrically connected to the first word line, one of a source and a drain of the first transistor is electrically connected to the first bit line, and the other of the source and the drain of the first transistor is electrically connected to a gate of the second transistor, wherein one of a source and a drain of the second transistor is electrically connected to the first wiring to which a potential V1 is supplied, and the other of the source and the drain of the second transistor is electrically connected to the second bit line, and wherein a gate of the third transistor is connected to the second word line, the method comprising the steps of:

setting a potential of the first bit line to a potential VH or a potential VL that is lower than VH and turning on the first transistor;

turning off the first transistor; and bringing the second bit line into a floating state at a potential V2, and then turning on the third transistor, wherein V2<V1<V3−Vth is satisfied where:

Vth is a threshold value of the second transistor; and

V3 is a potential of the gate of the second transistor after a retention period when the potential of the first bit line is set to VH, and wherein the retention period is a period between the step of turning off the first transistor and the step of bringing the second bit line into the floating state.

2. The driving method according to claim 1, wherein the first transistor is an n-channel transistor or a p-channel transistor, the second transistor is a p-channel transistor, and the third transistor is an n-channel transistor or a p-channel transistor.

3. The driving method according to claim 1, further comprising the step of, before bringing the second bit line into the floating state, turning off the third transistor and supplying V1 to the first wiring.

4. The driving method according to claim 1, wherein an average of VH and VL is lower than V1.

5. The driving method according to claim 1, wherein V3 is lower than or equal to 40% of VH.

6. The driving method according to claim 1, wherein when the third transistor is an n-channel transistor, a potential of the second word line is set to VH to turn on the third transistor.

7. The driving method according to claim 1, further comprising the step of, setting a potential of a second wiring electrically connected to a sense amplifier that is electrically connected to the second bit line to a reference potential, bringing the second wiring into the floating state, and then amplifying a potential different between the second bit line and the second wiring by the sense amplifier, so that the potential of the second wiring is output.

8. The driving method according to claim 7, wherein the reference potential is an average of VH and VL.

9. The driving method according to claim 1, wherein the first transistor includes an oxide semiconductor film in a channel formation region.

10. A driving method of a semiconductor device including a first word line, a second word line, a bit line, a first wiring, a first transistor, a second transistor, and a third transistor between the second transistor and the bit line or between the second transistor and the first wiring, wherein a gate of the first transistor is electrically connected to the first word line, one of a source and a drain of the first transistor is electrically connected to the bit line, and the other of the source and the drain of the first transistor is electrically connected to a gate of the second transistor, wherein one of a source and a drain of the second transistor is electrically connected to the first wiring to which a potential V1 is supplied, and the other of the source and the drain of the second transistor is electrically connected to the bit line, and wherein a gate of the third transistor is connected to the second word line, the method comprising the steps of:

setting a potential of the bit line to a potential VH or a potential VL that is lower than VH and turning on the first transistor;

turning off the first transistor; and bringing the bit line into a floating state at a potential V2, and then turning on the third transistor, wherein V2<V1<V3−Vth is satisfied where:

Vth is a threshold value of the second transistor; and

V3 is a potential of the gate of the second transistor after a retention period when the potential of the bit line is set to VH, and wherein the retention period is a period between the step of turning off the first transistor and the step of bringing the bit line into the floating state.

11. The driving method according to claim 10, wherein the first transistor is an n-channel transistor or a p-channel transistor, the second transistor is a p-channel transistor, and the third transistor is an n-channel transistor or a p-channel transistor.

12. The driving method according to claim 10, further comprising the step of, before bringing the bit line into the floating state, turning off the third transistor and supplying V1 to the first wiring.

13. The driving method according to claim 10, wherein an average of VH and VL is lower than V1.

14. The driving method according to claim 10, wherein V3 is lower than or equal to 40% of VH.

15. The driving method according to claim 10, wherein when the third transistor is an n-channel transistor, a potential of the second word line is set to VH to turn on the third transistor.

16. The driving method according to claim 10, further comprising the step of, setting a potential of a second wiring electrically connected to a sense amplifier that is electrically connected to the bit line to a reference potential, bringing the second wiring into the floating state, and then amplifying a potential different between the bit line and the second wiring by the sense amplifier, so that the potential of the second wiring is output.

17. The driving method according to claim 16, wherein the reference potential is an average of VH and VL.

18. The driving method according to claim 10, wherein the first transistor includes an oxide semiconductor film in a channel formation region.

19. A driving method of a semiconductor device including a first word line, a second word line, a bit line, a first wiring, a first transistor, a second transistor, a third transistor between the second transistor and the bit line or between the second transistor and the first wiring, and a capacitor, wherein a gate of the first transistor is electrically connected to the first word line, one of a source and a drain of the first transistor is electrically connected to the bit line, and the other of the source and the drain of the first transistor is electrically connected to a gate of the second transistor and one electrode of the capacitor, wherein one of a source and a drain of the second transistor is electrically connected to the first wiring to which a potential V1 is supplied, and the other of the source and the drain of the second transistor is electrically connected to the bit line, and wherein a gate of the third transistor is connected to the second word line, the method comprising the steps of:

setting a potential of the bit line to a potential VH or a potential VL that is lower than VH and turning on the first transistor;

turning off the first transistor; and bringing the bit line into a floating state at a potential V2 that is lower than V1, and then setting a potential of the other electrode of the capacitor to a potential V3 and turning on the third transistor.

20. The driving method according to claim 19, wherein V2+ΔV+Vth<V3<V1+Vth is satisfied where:

Vth is a threshold value of the second transistor;

ΔV is a potential decrease of the gate of the second transistor after a retention period when the potential of the bit line is set to VH;

V1 is VH; and

V2 is VL, wherein ΔV is larger than 0 and smaller than V1, and wherein the retention period is a period between the step of turning off the first transistor and the step of bringing the bit line into the floating state.

21. The driving method according to claim 19, wherein V3 is an average of V1 and V2.

22. The driving method according to claim 19, wherein V3 is lower than or equal to 40% of VH.

23. The driving method according to claim 19, wherein the first transistor includes an oxide semiconductor film in a channel formation region.

* * * * *